(12) United States Patent
Shin et al.

(10) Patent No.: US 11,393,801 B2
(45) Date of Patent: Jul. 19, 2022

(54) DISCRETE DECOUPLING CAPACITOR AND INTEGRATED CIRCUIT CHIP PACKAGE INCLUDING SAME

(71) Applicant: SAMSUNG ELECTRONICS CO., LTD., Suwon-si (KR)

(72) Inventors: Seunghun Shin, Suwon-si (KR); Jaejune Jang, Suwon-si (KR); Dukseo Park, Gyeonggi-do (KP); Sunwoo Park, Suwon-si (KR); Howoo Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 69 days.

(21) Appl. No.: 16/850,041

(22) Filed: Apr. 16, 2020

(65) Prior Publication Data
US 2021/0118618 A1    Apr. 22, 2021

(30) Foreign Application Priority Data
Oct. 16, 2019    (KR) .......................... 10-2019-0128716

(51) Int. Cl.
*H01L 25/16*    (2006.01)
*H01L 23/64*    (2006.01)
(Continued)

(52) U.S. Cl.
CPC .............. *H01L 25/16* (2013.01); *H01G 4/005* (2013.01); *H01G 4/012* (2013.01); *H01G 4/236* (2013.01);
(Continued)

(58) Field of Classification Search
CPC ....... H01L 25/16; H01L 23/642; H01L 24/48; H01L 24/73; H01L 25/105; H01L 24/32; H01L 24/19; H01L 25/0657; H01L 25/18; H01L 2224/48145; H01L 2224/48227; H01L 2224/32145; H01L 2224/32225; H01L 2224/73265; H01L 2225/06506; H01L 2225/0651; H01L 2225/06568; H01L 2225/1023; H01L 2225/1035;
(Continued)

(56) References Cited

U.S. PATENT DOCUMENTS 7,531,861 B2    5/2009    Chung et al.
9,269,762 B2    2/2016    Tzeng et al.
(Continued)

*Primary Examiner* — Ahmed N Sefer
(74) *Attorney, Agent, or Firm* — Volentine, Whitt & Francos, PLLC

(57) ABSTRACT

A decoupling capacitor includes a first insulating layer extending in a horizontal direction, a storage plate arranged on the first insulating layer, a top plate facing the storage plate, a second insulating layer interposed between the storage plate and the top plate and having a plurality of through holes, a capacitor block including a plurality of capacitor structures in the plurality of through holes, a wiring structure covering the top plate, a first conductive pad arranged on the wiring structure and configured to be electrically connected to the storage plate through a first conductive path of the wiring structure, and a second conductive pad spaced apart from the first conductive pad in the horizontal direction in the same plane as the first conductive pad and configured to be electrically connected to the top plate through a second conductive path of the wiring structure.

16 Claims, 28 Drawing Sheets

(51) Int. Cl.
*H01G 4/40* (2006.01)
*H01G 4/005* (2006.01)
*H01L 21/768* (2006.01)
*H01L 49/02* (2006.01)
*H01G 4/33* (2006.01)
*H01L 25/065* (2006.01)
*H01G 4/236* (2006.01)
*H01G 4/012* (2006.01)
*H01G 4/35* (2006.01)
*H01L 23/00* (2006.01)
*H01L 25/10* (2006.01)
*H01L 25/18* (2006.01)

(52) U.S. Cl.
CPC .............. *H01G 4/33* (2013.01); *H01G 4/40* (2013.01); *H01L 21/76885* (2013.01); *H01L 21/76897* (2013.01); *H01L 23/642* (2013.01); *H01L 25/065* (2013.01); *H01L 28/75* (2013.01); *H01L 28/91* (2013.01); *H01G 4/35* (2013.01); *H01L 24/19* (2013.01); *H01L 24/32* (2013.01); *H01L 24/48* (2013.01); *H01L 24/73* (2013.01); *H01L 25/0657* (2013.01); *H01L 25/105* (2013.01); *H01L 25/18* (2013.01)

(58) Field of Classification Search
CPC ... H01L 2225/1058; H01L 2924/15311; H01L 2924/19041; H01L 2924/19105; H01L 2224/04105; H01L 2224/12105; H01L 28/75; H01L 28/91; H01L 21/76897; H01L 21/76885; H01L 25/065; H01G 4/40; H01G 4/005; H01G 4/35
See application file for complete search history.

(56) References Cited

U.S. PATENT DOCUMENTS

| | | | |
|---|---|---|---|
| 9,640,445 B1* | 5/2017 | Hwang | H01L 21/76831 |
| 9,947,709 B2 | 4/2018 | Huang et al. | |
| 10,242,943 B2 | 3/2019 | Murray et al. | |
| 10,644,099 B1* | 5/2020 | Seidel | H01L 28/75 |
| 2003/0183862 A1* | 10/2003 | Jin | H01L 28/91 |
| | | | 257/301 |
| 2005/0266652 A1* | 12/2005 | Chudzik | H01L 23/5223 |
| | | | 438/387 |
| 2006/0267098 A1* | 11/2006 | Fujimaki | H01L 28/91 |
| | | | 257/350 |
| 2013/0242643 A1* | 9/2013 | Kim | G11C 11/4074 |
| | | | 365/149 |
| 2015/0295019 A1* | 10/2015 | Wang | H01L 23/585 |
| | | | 257/532 |
| 2017/0207299 A1* | 7/2017 | Lin | H01L 28/60 |
| 2018/0040610 A1 | 2/2018 | Yamamoto | |
| 2019/0096587 A1* | 3/2019 | Shin | H01G 4/085 |
| 2019/0096800 A1 | 3/2019 | Wei et al. | |
| 2019/0115422 A1 | 4/2019 | Akcasu | |
| 2020/0066922 A1* | 2/2020 | Cheng | H01L 29/945 |
| 2020/0176552 A1* | 6/2020 | Chang | H01L 21/02271 |

\* cited by examiner

DISCRETE DECOUPLING CAPACITOR AND INTEGRATED CIRCUIT CHIP PACKAGE INCLUDING SAME

CROSS-REFERENCE TO RELATED APPLICATION

This application claims the benefit of Korean Patent Application No. 10-2019-0128716, filed on Oct. 16, 2019 in the Korean Intellectual Property Office, the subject matter of which is hereby incorporated by reference.

BACKGROUND

The inventive concept relates to capacitors and integrated circuit chip packages, and more particularly, to discrete decoupling capacitors and integrated circuit chip packages including same.

As integrated circuit devices become more densely integrated and operate at increasing data transmission speeds noise becomes a significant problem. That is, wiring (e.g., signal lines.) internally and/or externally connected to an integrated circuit chip tend to generate noise in response to high-speed switching, for example. Such noise may occur in relation to a grounded surface. Additionally or alternatively, power source(s) or wiring connected to a power source may become a serious noise source, and in extreme circumstances may cause erroneous operation in integrated circuit device. In order to minimize the influence of noise, a decoupling capacitor may be used. Recently, as there is a need for small smart devices, in order to reduce a total thickness and planar area of an integrated circuit chip package while maintaining reliability of the integrated circuit chip package, a small and thin decoupling capacitor needs to be developed.

SUMMARY

Certain embodiments of the inventive concept provide a discrete decoupling capacitor having a small and thin structure, and yet also providing increased capacitance per unit area. Other embodiments of the inventive concept provide an integrated circuit chip package including this type of discrete decoupling capacitor.

According to an aspect of the inventive concept, there is provided a discrete decoupling capacitor including; a first insulating layer extending in a horizontal direction, a storage plate arranged on the first insulating layer, a top plate spaced apart from the storage plate in a vertical direction and facing the storage plate, a second insulating layer interposed between the storage plate and the top plate and having a plurality of through holes, a capacitor block including a plurality of capacitor structures respectively formed in the plurality of through holes, a wiring structure covering the top plate, a first conductive pad arranged on the wiring structure and configured to electrically connect the storage plate through a first conductive path of the wiring structure, and a second conductive pad spaced apart from the first conductive pad in the horizontal direction, arranged in a same plane as the first conductive pad, and configured to electrically connect the top plate through a second conductive path of the wiring structure.

According to another aspect of the inventive concept, there is provided a discrete decoupling capacitor including; a first insulating layer extending in a horizontal direction, a second insulating layer arranged on a top surface of the first insulating layer and having a plurality of through holes, a capacitor block including a plurality of capacitor structures respectively arranged in the plurality of through holes, wherein the plurality of capacitor structures include a lower electrode, an upper electrode, and a dielectric layer interposed between the lower electrode and the upper electrode, a top plate arranged on the second insulating layer and on the capacitor block and connected to the plurality of capacitor structures, a wiring structure covering the top plate, a first conductive pad arranged on the wiring structure and configured to electrically connect the lower electrode through a first conductive path of the wiring structure, and a second conductive pad spaced apart from the first conductive pad in the horizontal direction, arranged in a same plane as the first conductive pad, and configured to electrically connect the top plate through a second conductive path of the wiring structure.

According to another aspect of the inventive concept, there is provided an integrated circuit chip package including a discrete decoupling capacitor. Here, the discrete decoupling capacitor includes; a first insulating layer extending in a horizontal direction, a storage plate arranged on the first insulating layer, a top plate spaced apart from the storage plate in a vertical direction and facing the storage plate, a second insulating layer interposed between the storage plate and the top plate and having a plurality of through holes, a capacitor block including a plurality of capacitor structures respectively formed in the plurality of through holes, a wiring structure covering the top plate, a first conductive pad arranged on the wiring structure and configured to electrically connect the storage plate through a first conductive path of the wiring structure, and a second conductive pad spaced apart from the first conductive pad in the horizontal direction, arranged in a same plane as the first conductive pad, and configured to electrically connect the top plate through a second conductive path of the wiring structure.

BRIEF DESCRIPTION OF THE DRAWINGS

Embodiments of the inventive concept will be more clearly understood from the following detailed description taken in conjunction with the accompanying drawings in which:

FIGS. 8 through 13 (each FIG. respectively including an 'A' plan perspective and a 'B' cross-sectional perspective) are respective views variously illustrating aspects of a method of manufacturing a decoupling capacitor according to embodiments of the inventive concept.

DETAILED DESCRIPTION

Hereinafter, embodiments of the inventive concept will be described in some additional detail with reference to the accompanying drawings, wherein like reference numbers and labels are used to denote like or similar elements, components and/or method steps.

Figure 1A:
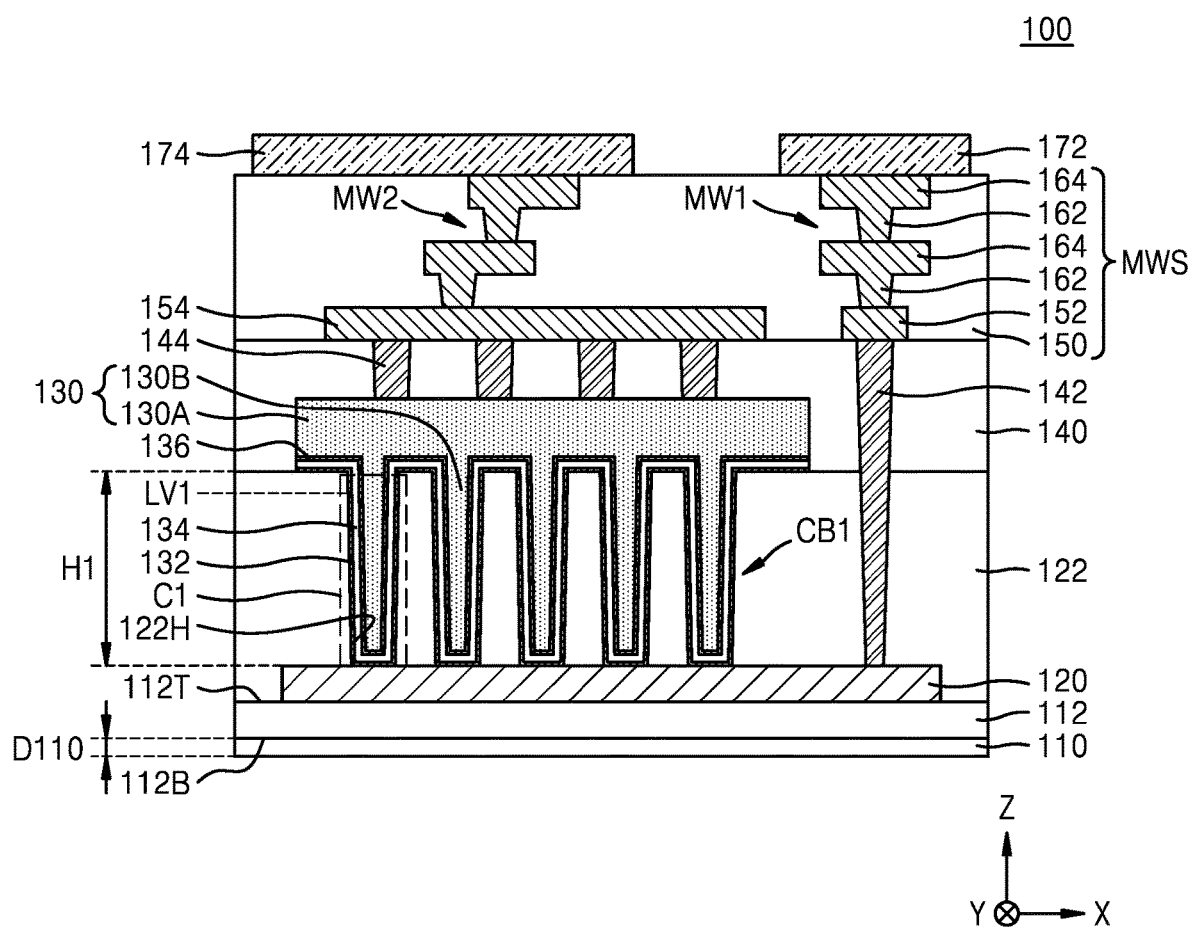
FIG. 1A is a cross-sectional view illustrating some components of a decoupling capacitor according to embodiments of the inventive concept.
Figure 1B:
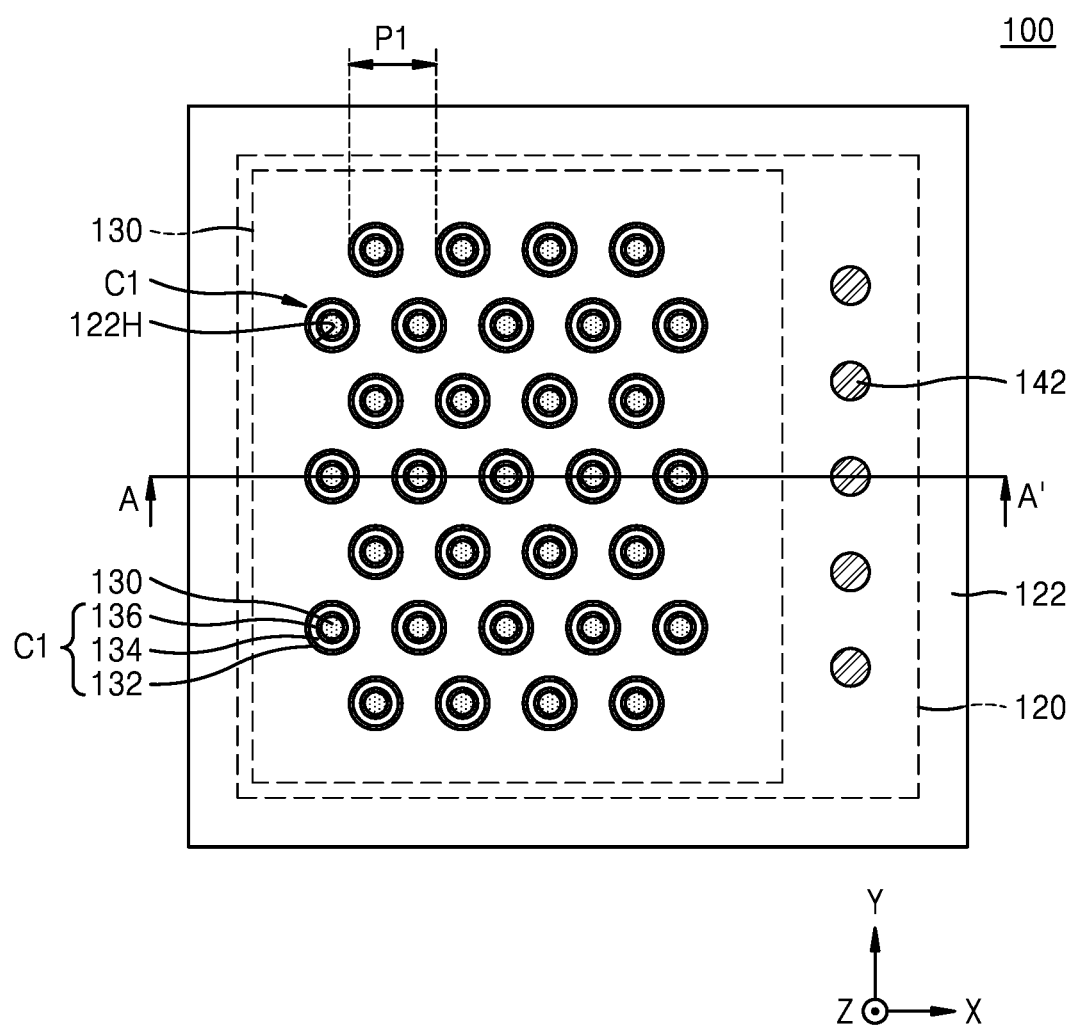
FIG. 1B is a plan view illustrating some components of FIG. 1A.

FIG. 1A is a cross-sectional view illustrating some components of a decoupling capacitor 100 according to embodiments of the inventive concept. FIG. 1B is a related plan view illustrating some components of FIG. 1A at a first level LV1. In FIG. 1B, in order to further appreciate the presented teachings, a plane for each of a storage plate 120 and a top plate 130 included in the decoupling capacitor 100 is marked with a dotted line. The decoupling capacitor 100 shown in FIGS. 1A and 1B is a discrete decoupling capacitor according to embodiments of the inventive concept.

Referring to FIGS. 1A and 1B, the decoupling capacitor 100 includes a substrate 110, a first insulating layer 112 extending on the substrate 110 in the horizontal direction (i.e., in a direction parallel to the X-Y plane illustrated in FIG. 1A), the storage plate 120 arranged on a top surface 112T of the first insulating layer 112, and the top plate 130 spaced apart from the storage plate 120 in a vertical direction (i.e., the Z direction indicated in FIG. 1A). Between the storage plate 120 and the top plate 130, a second insulating layer 122 and a capacitor block CB1 including a plurality of capacitor structures C1 are interposed. The plurality of capacitor structures C1 may longitudinally extend in the vertical direction (the Z direction) so as to pass through the second insulating layer 122. The storage plate 120 may be formed of tungsten (W), for example. The top plate 130 may be formed of a conductive semiconductor material, such as silicon germanium (SiGe), for example.

A plurality of through holes 122H may be formed in the second insulating layer 122, and the plurality of capacitor structures C1 may be formed in the plurality of through holes 122H. As illustrated in FIG. 1B, the plurality of through holes 122H and the plurality of capacitor structures C1 may be arranged in a hexagonal array structure in a plane extending along the horizontal (X-Y) direction. The plurality of through holes 122H and the plurality of capacitor structures C1 may each have a vertical height H1 ranging from between about 1 µm and about 2 µm and may be formed with a pitch P1 ranging from about 80 nm to about 150 nm. For example, the plurality of through holes 122H and the plurality of capacitor structures C1 may each have a height H1 of about 1.5 µm and may be arranged with a pitch P1 of about 120 nm.

The substrate 110 may be formed of semiconductor or glass. In exemplary embodiments, the substrate 110 may be formed of silicon (Si). The first insulating layer 112 may be formed of an oxide layer, a nitride layer, or a combination of oxide and nitride layers. For example, the first insulating layer 112 may be formed of a silicon oxide layer.

Each of the plurality of capacitor structures C1 may include a lower electrode 132, a dielectric layer 134, and an upper electrode 136 that are sequentially stacked in each of the plurality of through holes 122H. In each of the plurality of through holes 122H, the lower electrode 132, the dielectric layer 134, and the upper electrode 136 may be cylindrical in shape, wherein the lower electrode 132 contacts an internal wall of each of the plurality of through holes 122H, an upper surface of the storage plate 120, and an upper surface of the second insulating layer 122. The lower electrode 132 may conformally cover the internal wall of each of the plurality of through holes 122H, the upper surface of the storage plate 120, and the upper surface of the second insulating layer 122. The upper electrode 136 may include a portion that conformally covers the dielectric layer 134 in each of the plurality of through holes 122H and a portion that conformally covers the dielectric layer 134 on the upper surface of the second insulating layer 122. The dielectric layer 134 may be interposed between the lower electrode 132 and the upper electrode 136 inside and outside each of the plurality of through holes 122H.

In the capacitor block CB1, the plurality of capacitor structures C1 may share one lower electrode 132, one dielectric layer 134, and one upper electrode 136. Each of the plurality of capacitor structures C1 may include the lower electrode 132 that covers the internal wall of each of the plurality of through holes 122H and contacts the storage plate 120 and the lower electrodes 132. The plurality of capacitor structures C1 may be integrally connected to each other. In the horizontal direction, the lower electrode 132, the dielectric layer 134, and the upper electrode 136 may have a planar area the same as, or similar to, the planar area of the top plate 130.

Each of the lower electrode 132 and the upper electrode 136 may be formed of a metal layer, a metal oxide layer, a metal nitride layer, and/or a metal oxynitride layer. Here, one or more of the metal layer, the metal oxide layer, the metal nitride layer and/or the metal oxynitride layer may be composed of (or include) the same metal (i.e., a first metal). In exemplary embodiments, the first metal may be titanium (Ti), cobalt (Co), niobium (Nb), or tin (Sn). In exemplary embodiments, each of the lower electrode 132 and the upper electrode 136 may include Ti, an Ti oxide, a Ti nitride, a Ti oxynitride, Co, a Co oxide, a Co nitride, a Co oxynitride, Nb, an Nb oxide, an Nb nitride, an Nb oxynitride, Sn, an Sn oxide, an Sn nitride, an Sn oxynitride, or a combination of the above materials. For example, each of the lower electrode 132 and the upper electrode 136 may be formed of TiN, CoN, NbN, $SnO_2$, or a combination of the above materials.

The dielectric layer 134 may be formed of a metal oxide layer including a second metal. The second metal may be hafnium (Hf), zirconium (Zr), Nb, cerium (Ce), or Ti. In exemplary embodiments, the dielectric layer 134 may be formed of $AlO_2$, $ZrO_2$, $HfO_2$, $Nb_2O_5$, $CeO_2$, or $TiO_2$. For example, each of the lower electrode 132 and the upper electrode 136 may be formed of a TiN layer and the dielectric layer 134 may be formed of a multilayer in which an $AlO_2$ layer and a $ZrO_2$ layer are alternately stacked a plurality of number of times.

The top plate 130 may include a first portion 130A that faces the storage plate 120, extends in parallel with the storage plate 120 in the horizontal direction, and contacts the upper electrode 136 outside the plurality of through holes 122H. The top plate may also include a plurality of second portions 130B that protrude from the first portion 130A through the plurality of through holes 122H toward the storage plate 120 and contact the upper electrode 136 in the plurality of through holes 122H. The first portion 130A and the plurality of second portions 130B of the top plate 130 may be integrally formed.

The top plate 130 and the second insulating layer 122 may be covered with a third insulating layer 140, and a wiring structure MWS may be formed on the third insulating layer 140. The wiring structure MWS may include a plurality of wiring layers (e.g., wiring layers 152, 154, and 164) and a plurality of contact plugs 162. In the wiring structure MWS, the plurality of wiring layers 152, 154, and 164 and the plurality of contact plugs 162 may be respectively insulated from different conductors adjacent to each other in the horizontal direction by a fourth insulating layer 150. Each of the third insulating layer 140 and the fourth insulating layer 150 may be formed of one or more oxide layer(s), nitride layer(s) or a combination of same. Each of the plurality of wiring layers 152, 154, and 164 and the plurality of contact plugs 162 may include a metal wiring pattern and a conductive barrier layer that surrounds at least part of the metal wiring pattern. In exemplary embodiments, the metal wiring pattern may be formed of Cu and the conductive barrier layer may be formed of Ti, TiN, Ta, TaN, or a combination of the above metals.

On the wiring structure MWS, a first conductive pad 172 and a second conductive pad 174 may be formed. Each of the first conductive pad 172 and the second conductive pad 174 may include a metal pad and a conductive pad barrier layer that surrounds at least part of the metal pad. In exemplary embodiments, the metal pad may be formed of aluminum (Al) and the conductive pad barrier layer may be formed of Ti, TiN, Ta, TaN, or a combination of the above metals.

The first conductive pad 172 may be electrically connected to the storage plate 120 through a first conductive path MW1 of the wiring structure MWS. The first conductive path MW1 may be formed of selected portions of the wiring layers 152 and 164 and the contact plugs 162 of the wiring structure MWS.

The second conductive pad 174 may be arranged in the same plane as the first conductive pad 172 and may be spaced apart from the first conductive pad 172 in the horizontal direction. The second conductive pad 174 may be electrically connected to the top plate 130 through a second conductive path MW2 of the wiring structure MWS. The second conductive path MW2 may be formed of selected portions of the wiring layers 154 and 164 and the contact plugs 162 of the wiring structure MWS.

A plurality of first contact plugs 142 may vertically extend (in the Z direction) between the storage plate 120 and the first conductive path MW1 of the wiring structure MWS. The plurality of first contact plugs 142 may be spaced apart from the capacitor bock CB1 and the top plate 130 in the horizontal direction through the second insulating layer 122 and the third insulating layer 140. A plurality of second contact plugs 144 may vertically extend (in the Z direction) between the top plate 130 and the second conductive path MW2 of the wiring structure MWS. The plurality of second contact plugs 144 may be spaced apart through the third insulating layer 140. The plurality of first contact plugs 142 and the plurality of second contact plugs 144 may be formed of W.

Each of the plurality of first contact plugs 142 may have a bottom surface that contacts the storage plate 120. Each of the plurality of first contact plugs 142 may have an upper surface that contacts the wiring layer 152 arranged at a vertical level (in the Z direction) closest to the storage plate 120 among the plurality of wiring layers 152, 154, and 164 included in the wiring structure MWS. The storage plate 120 may be connected to the first conductive pad 172 through a first contact plug 142 and the first conductive path MW1 of the wiring structure MWS.

Each of the plurality of second contact plugs 144 may have a bottom surface that contacts the top plate 130. Each of the plurality of second contact plugs 144 may have an upper surface that contacts the wiring layer 154 arranged at a vertical level (in the Z direction) closest to the top plate 130 among the plurality of wiring layers 152, 154, and 164 included in the wiring structure MWS. The top plate 130 may be connected to the second conductive pad 174 through the second contact plugs 144 and the second conductive path MW2 of the wiring structure MWS.

In the first insulating layer 112, a bottom surface 112B opposite to the top surface 112T may cover the substrate 110, wherein a thickness D110 of the substrate 110 may be less than a thickness of the first insulating layer 112 in the vertical direction (the Z direction). In exemplary embodiments, the thickness D110 of the substrate 110 may be less than about 60 μm. For example, the thickness D110 of the substrate 110 may be less than about 3 μm. In exemplary embodiments, the substrate 110 may be omitted.

The decoupling capacitor 100 described with reference to FIGS. 1A and 1B may have a total vertical height (in the Z direction) ranging from between about 10 μm to about 30 μm. Since the capacitor block CB1 included in the decoupling capacitor 100 includes the plurality of capacitor structures C1 arranged with a fine pitch P1 and high density, the total thickness of the decoupling capacitor 100 may be maintained to be small while the resulting capacitance per unit area may be remarkably increased. In certain embodiments, a capacitance per $mm^2$ of at least 1,000 nF has been realized for the decoupling capacitor 100, and in other embodiments, a capacitance per $mm^2$ of at least 2,000 nF has been realized.

Figure 2A:
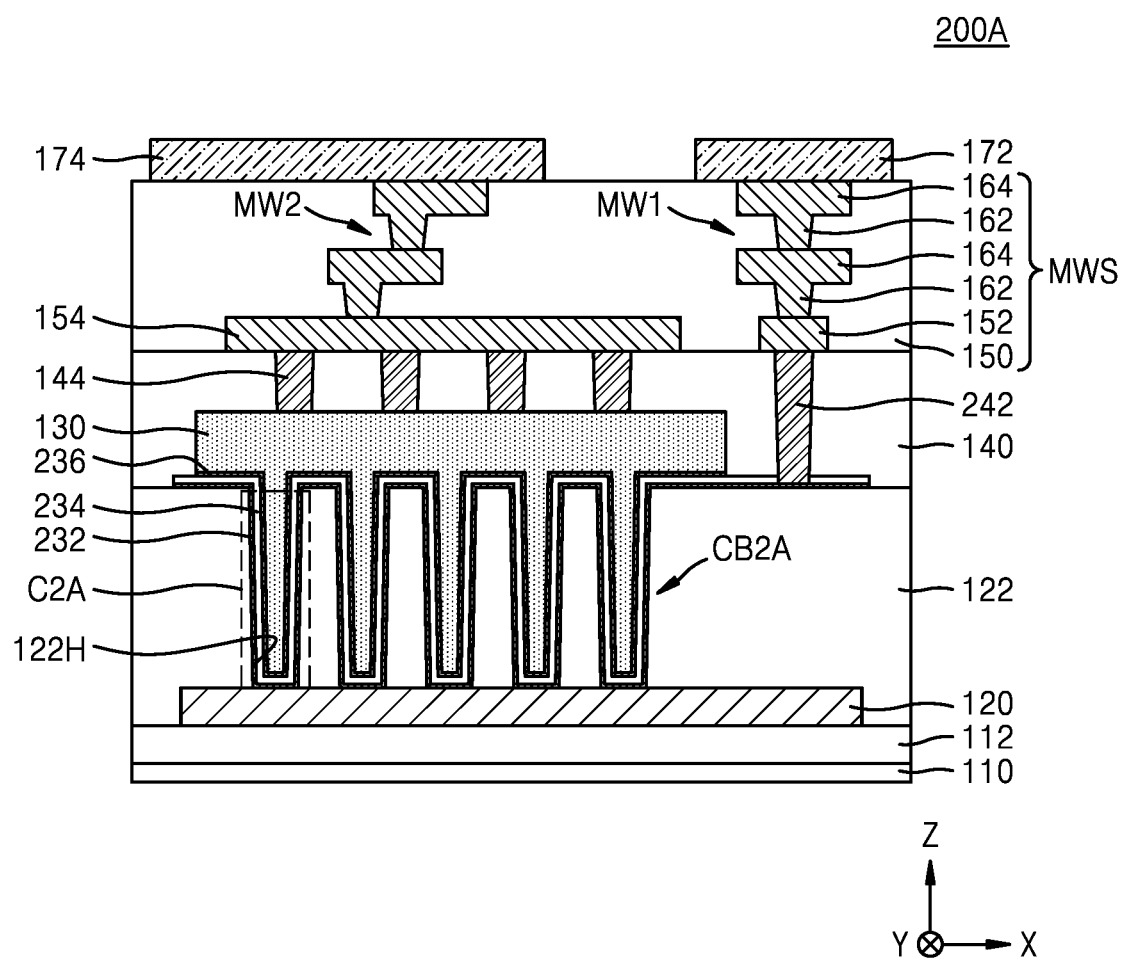
FIG. 2A is a cross-sectional view illustrating a decoupling capacitor according to other embodiments of the inventive concept.

FIG. 2A is a cross-sectional view illustrating a decoupling capacitor 200A according to other embodiments of the inventive concept.

The decoupling capacitor 200A has almost the same configuration as the decoupling capacitor 100 described with reference to FIGS. 1A and 1B. The decoupling capacitor 200A includes a capacitor block CB2A including a plurality of capacitor structures C2A. Each of the plurality of capacitor structures C2A includes a lower electrode 232, a dielectric layer 234, and an upper electrode 236 that are sequentially stacked in each of the plurality of through holes 122H of the second insulating layer 122. The lower electrode 232, the dielectric layer 234, and the upper electrode 236 may have almost the same configurations as those of the lower electrode 132, the dielectric layer 134, and the upper electrode 136 that are described with reference to FIGS. 1A and 1B. In the horizontal direction, the lower electrode 232 and the dielectric layer 234 have plane areas greater than that of the top plate 130. The lower electrode 232 and the dielectric layer 234 may protrude from side walls of the top plate 130 outward the top plate 130 in the horizontal direction.

In the capacitor block CB2A, the plurality of capacitor structures C2A may share one lower electrode 232, one dielectric layer 234, and one upper electrode 236. Each of the plurality of capacitor structures C2A that form the capacitor block CB2A may include the lower electrode 232 that is arranged in each of the plurality of through holes 122H and contacts the storage plate 120 and the lower electrodes 232 of the plurality of capacitor structures C2A may be integrally connected to each other.

Between the lower electrodes 232 and the first conductive path MW1 of the wiring structure MWS, a first contact plug 242 may be arranged. The first contact plug 242 may longitudinally extend in a position spaced apart from the top plate 130 in the horizontal direction through the dielectric layer 234 and the third insulating layer 140 in the vertical direction (the Z direction). The first contact plug 242 may be formed of W.

The first contact plug 242 may have a bottom surface that contacts the lower electrodes 232. The first contact plug 242 may have an upper surface that contacts the wiring layer 152 arranged at the level closest to the storage plate 120 in the vertical direction (the Z direction) among the plurality of wiring layers 152, 154, and 164 included in the wiring structure MWS. The lower electrodes 232 may be connected to the first conductive pad 172 through the first contact plug 242 and the first conductive path MW1 of the wiring structure MWS. The first conductive pad 172 may be electrically connected to the lower electrodes 232 without through the storage plate 120.

Figure 2B:
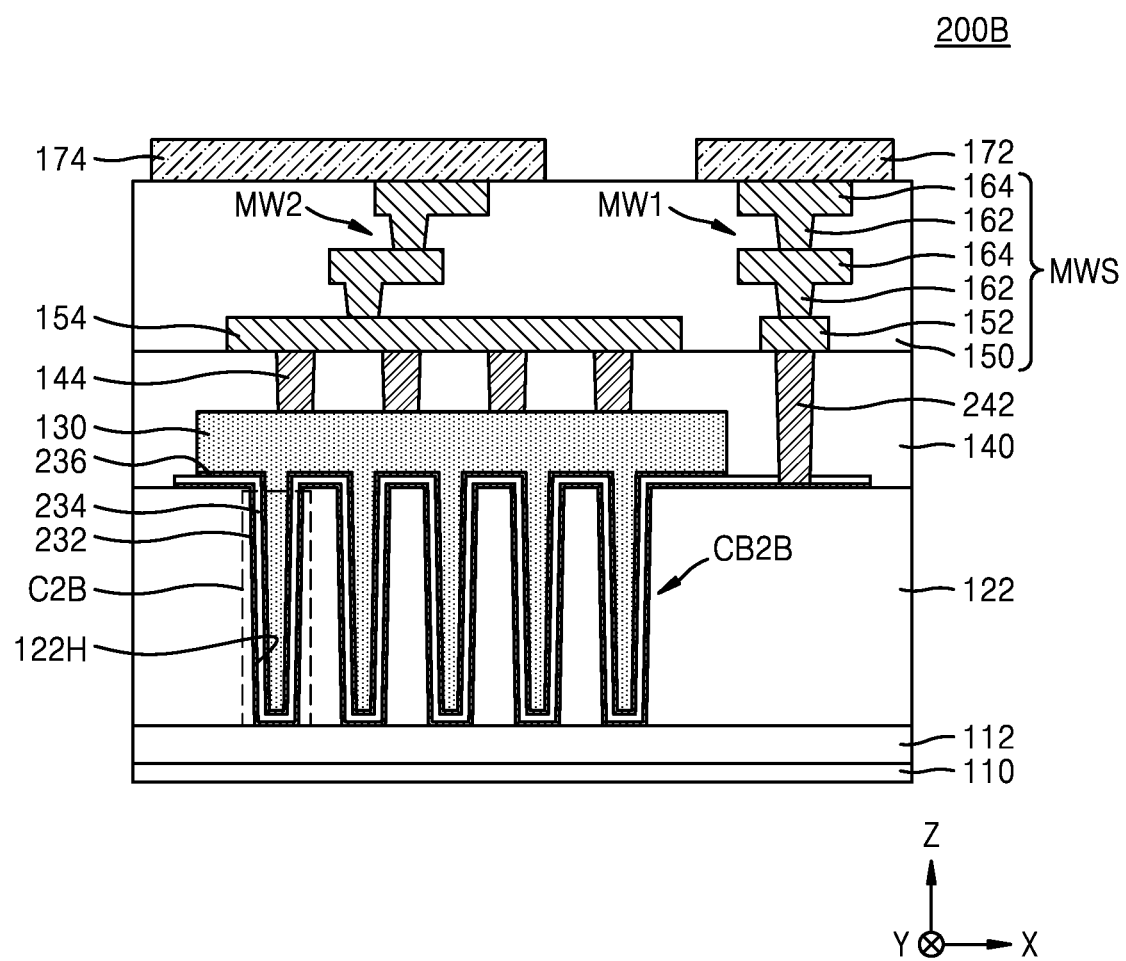
FIG. 2B is a cross-sectional view illustrating a decoupling capacitor according to other embodiments of the inventive concept.

FIG. 2B is a cross-sectional view illustrating a decoupling capacitor 200B according to other embodiments of the inventive concept.

The decoupling capacitor 200B has almost the same configuration as the decoupling capacitor 200A described with reference to FIG. 2A. The decoupling capacitor 200B includes a capacitor block CB2B formed of a plurality of capacitor structures C2B. In addition, unlike the decoupling capacitor 200A described with reference to FIG. 2A, the decoupling capacitor 200B does not include the storage plate 120 between the first insulating layer 112 and the capacitor block CB2B.

Here, the plurality of capacitor structures C2B have almost the same configuration as those of the plurality of capacitor structures C2A described with reference to FIG. 2A. The lower electrodes 232 of the plurality of capacitor structures C2B contact the first insulating layer 112 in the plurality of through holes 122H. The lower electrodes 232 of the plurality of capacitor structures C2B may be connected to the first conductive pad 172 through the first contact plug 242 and the first conductive path MW1 of the wiring structure MWS.

Figure 3:
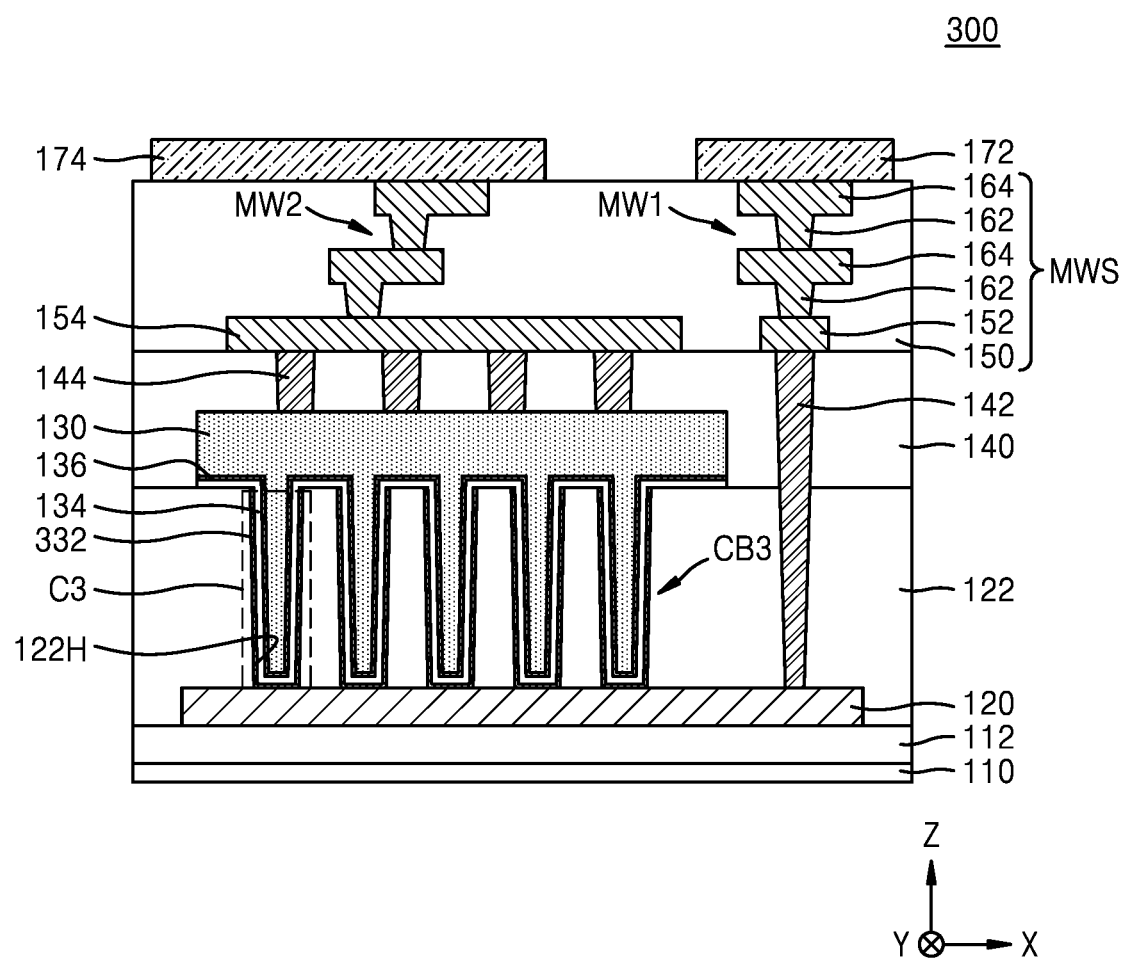
FIG. 3 is a cross-sectional view illustrating a decoupling capacitor according to other embodiments of the inventive concept.

FIG. 3 is a cross-sectional view illustrating a decoupling capacitor 300 according to other embodiments of the inventive concept.

The decoupling capacitor 300 has almost the same configuration as the decoupling capacitor 100 described with reference to FIGS. 1A and 1B. However, the decoupling capacitor 300 includes a capacitor block CB3 including a plurality of capacitor structures C3. Each of the plurality of capacitor structures C3 includes a lower electrode 332, a dielectric layer 134, and an upper electrode 136 that are sequentially stacked in each of the plurality of through holes 122H of the second insulating layer 122. The lower electrodes 332 of the plurality of capacitor structures C3 are spaced apart from each other in the horizontal direction. The lower electrodes 332 of the plurality of capacitor structures C3 may be selectively arranged within the plurality of through holes 122H of the second insulating layer 122 but not without the plurality of through holes 122H. The lower electrodes 332 of the plurality of capacitor structures C3 may contact the storage plate 120 in the plurality of through holes 122H of the second insulating layer 122. Here, the lower electrodes 332 have almost the same configuration as the lower electrode 132 described with reference to FIGS. 1A and 1B.

The dielectric layers 134 may include portions that contact the upper surface of the second insulating layer 122. The plurality of capacitor structures C3 may share one dielectric layer 134 and one upper electrode 136.

Figure 4:
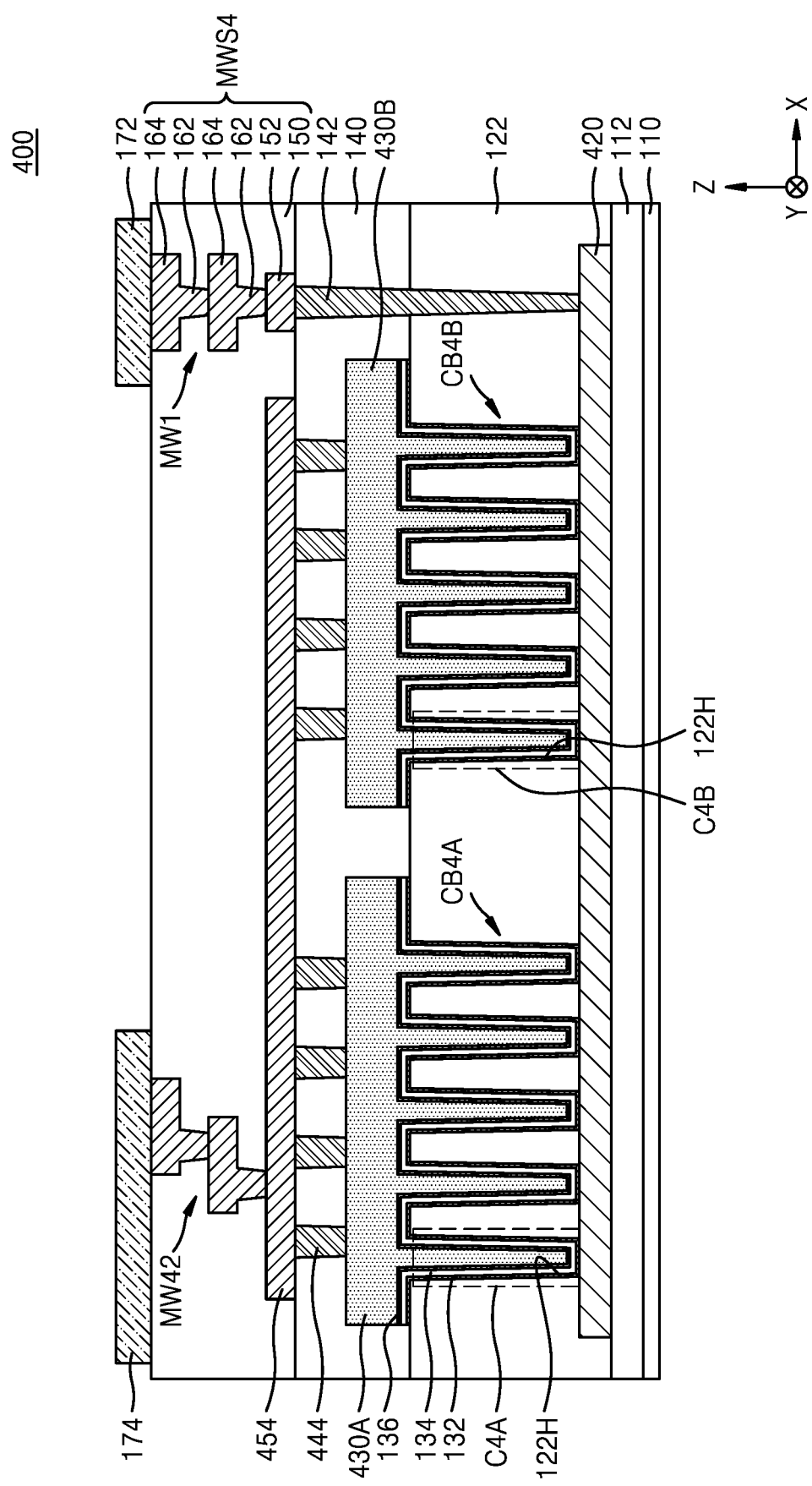
FIG. 4 is a cross-sectional view illustrating a decoupling capacitor according to other embodiments of the inventive concept.

FIG. 4 is a cross-sectional view illustrating a decoupling capacitor 400 according to other embodiments of the inventive concept.

The decoupling capacitor 400 has almost the same configuration as the decoupling capacitor 100 described with reference to FIGS. 1A and 1B. However, the decoupling capacitor 400 includes a plurality of capacitor blocks CB4A and CB4B spaced apart in the horizontal direction, where the plurality of capacitor blocks CB4A and CB4B respectively include a first capacitor block CB4A and a second capacitor block CB4B.

The first capacitor block CB4A includes a plurality of first capacitor structures C4A connected to a storage plate 420 through the second insulating layer 122 in the vertical direction (the Z direction). The second capacitor block CB4B includes a plurality of second capacitor structures C4B connected to the storage plate 420 through the second insulating layer 122 in the vertical direction (the Z direction) and spaced apart from the plurality of first capacitor structures C4A in the horizontal direction. Each of the plurality of first capacitor structures C4A and the plurality of second capacitor structures C4B may include a lower electrode 132, a dielectric layer 134, and an upper electrode 136.

The storage plate 420 may extend in the horizontal direction so as to overlap the first and second capacitor blocks CB4A and CB4B in the vertical direction (the Z direction). The storage plate 420 may include a portion that contacts the first contact plug 142. Here, the storage plate 420 has almost the same configuration as the storage plate 120 described with reference to FIGS. 1A and 1B.

On the second insulating layer 122, a first top plate 430A and a second top plate 430B may be arranged. The first top plate 430A and the second top plate 430B may be spaced apart in the horizontal direction. The first top plate 430A may be connected to the first capacitor block CB4A and the second top plate 430B may be connected to the second capacitor block CB4B. The first top plate 430A may contact the upper electrode 136 of the plurality of first capacitor structures C4A. The second top plate 430B may contact the upper electrode 136 of the plurality of second capacitor structures C4B. Here, the first top plate 430A and the second top plate 430B may have the same configuration as the top plate 130 described with reference to FIGS. 1A and 1B.

The first top plate 430A and the second top plate 430B may be covered by the third insulating layer 140 and a wiring structure MWS4 may be arranged on the third insulating layer 140.

Between the first top plate 430A and the second top plate 430B and a second conductive path MW42 of the wiring structure MWS4, a plurality of second contact plugs 444 passes through the third insulating layer 140. The plurality of second contact plugs 444 and the wiring structure MWS4 may have almost the same respective configurations as the second contact plugs 144 and the wiring structure MWS described with reference to FIGS. 1A and 1B. The wiring structure MWS4 may include a wiring layer 454 arranged at the level (in the Z direction) closest to the first top plate 430A and the second top plate 430B. The plurality of second contact plugs 444 may have upper surfaces that contact the wiring layer 454. The first top plate 430A and the second top plate 430B may be connected to the second conductive pad 174 through the plurality of second contact plugs 144 and the second conductive path MW42 of the wiring structure MWS4.

Figure 5:
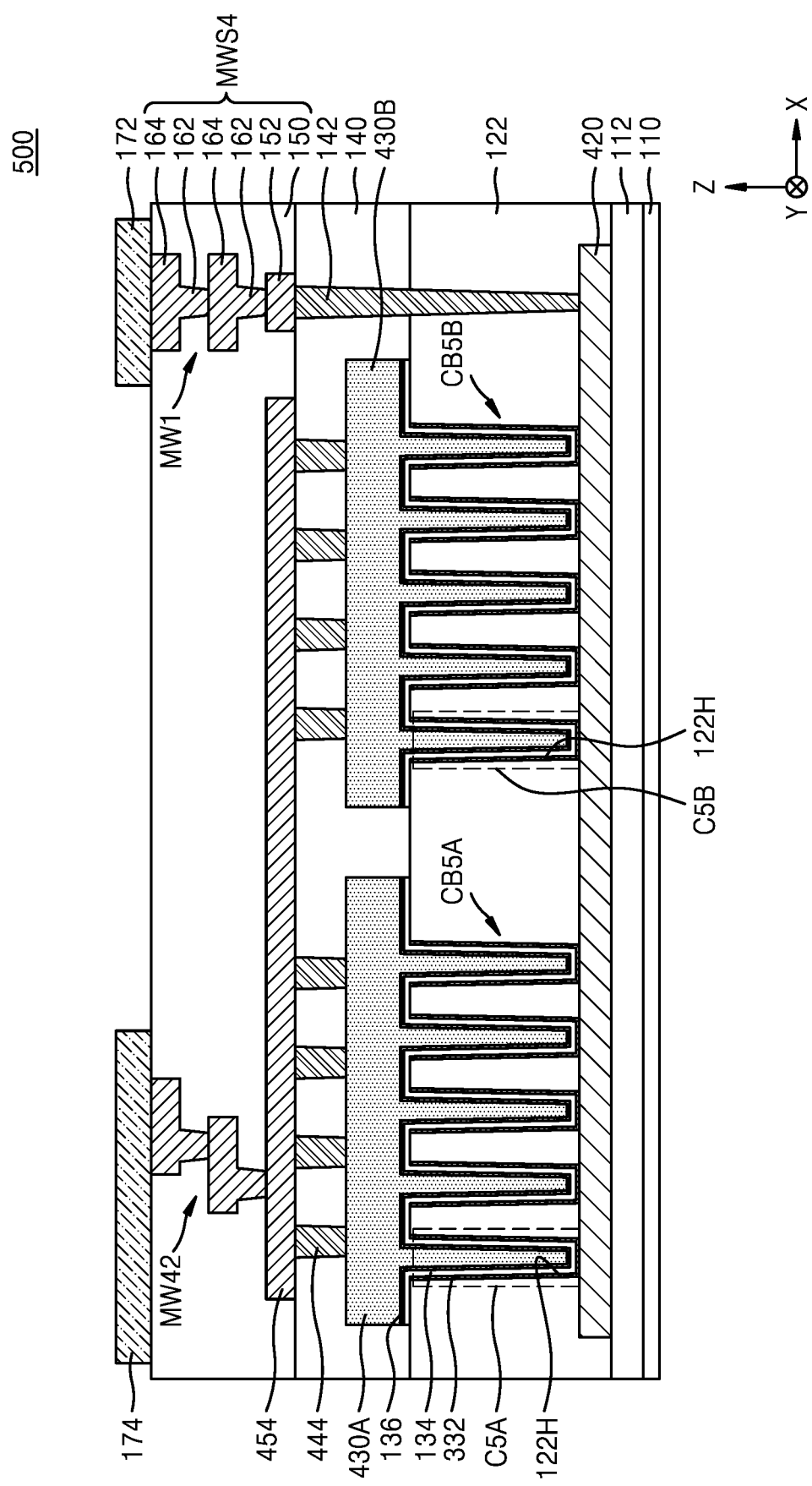
FIG. 5 is a cross-sectional view illustrating a decoupling capacitor according to other embodiments of the inventive concept.

FIG. 5 is a cross-sectional view illustrating a decoupling capacitor 500 according to other embodiments of the inventive concept.

The decoupling capacitor 500 may have almost the same configuration as the decoupling capacitor 400 described with reference to FIG. 4. However, the decoupling capacitor 500 includes a plurality of capacitor blocks CB5A and CB5B spaced apart in the horizontal direction. The plurality of capacitor blocks CB5A and CB5B may include a first capacitor block CB5A and a second capacitor block CB5B.

The first capacitor block CB5A includes a plurality of first capacitor structures C5A connected to the storage plate 420 through the second insulating layer 122 in the vertical direction (the Z direction). The second capacitor block CB5B includes a plurality of second capacitor structures C5B connected to the storage plate 420 through the second insulating layer 122 in the vertical direction (the Z direction) and spaced apart from the plurality of first capacitor structures C5A in the horizontal direction. Each of the plurality of first capacitor structures C5A and the plurality of second capacitor structures C5B may include a lower electrode 332, a dielectric layer 134, and an upper electrode 136.

The lower electrodes 332 of the plurality of first capacitor structures C5A and the plurality of second capacitor structures C5B are spaced apart in the horizontal direction. Here, the lower electrode 332 may have the same configuration as described with reference to FIG. 3.

Figure 6:
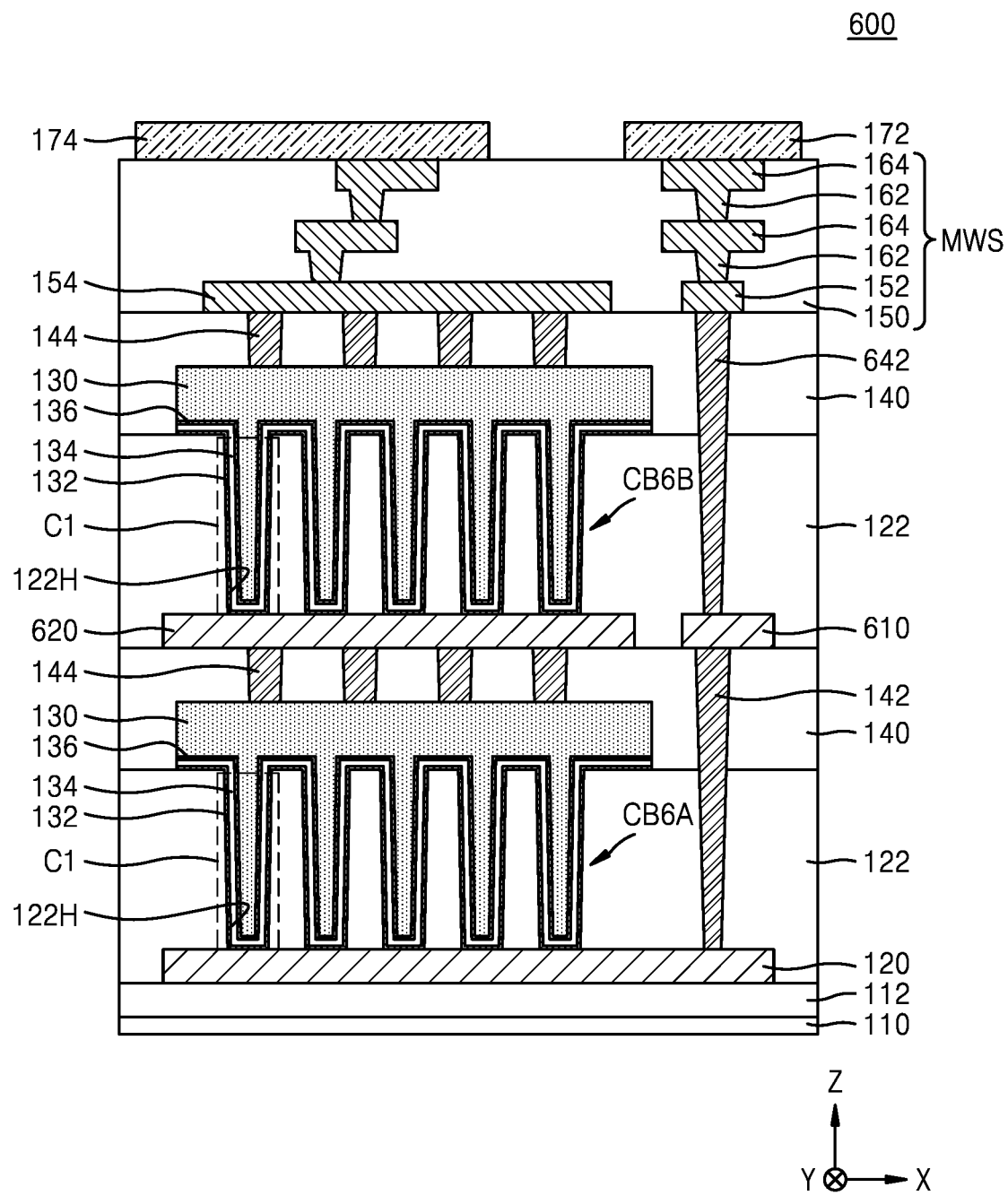
FIG. 6 is a cross-sectional view illustrating a decoupling capacitor according to other embodiments of the inventive concept.

FIG. 6 is a cross-sectional view illustrating a decoupling capacitor 600 according to other embodiments of the inventive concept.

The decoupling capacitor 600 may have almost the same configuration as the decoupling capacitor 100 described with reference to FIGS. 1A and 1B. However, the decoupling capacitor 600 includes a plurality of capacitor blocks CB6A and CB6B that overlap each other in the vertical direction (the Z direction). The plurality of capacitor blocks CB6A and CB6B may include a lower capacitor block CB6A closer to the storage plate 120 and an upper capacitor block CB6B closer to the wiring structure MWS. Here, the lower capacitor block CB6A and the upper capacitor block CB6B may have almost the same structure as the capacitor block CB1 described with reference to FIGS. 1A and 1B.

The upper electrode 136 of each of the lower capacitor block CB6A and the upper capacitor block CB6B may contact the top plate 130. Between the top plate 130 that contacts the upper electrode 136 of the lower capacitor block CB6A and the upper capacitor block CB6B, an intermediate storage plate 620 may be interposed. The top plate 130 that contacts the upper electrode 136 of the lower capacitor block CB6A and the intermediate storage plate 620 may be connected to each other by the plurality of second contact plugs 144. The lower electrode 132 of the upper capacitor block CB6B may contact the intermediate storage plate 620.

A conductive landing pad 610 may be arranged in a position spaced apart from the intermediate storage plate 620 in the horizontal direction at the same level as the intermediate storage plate 620. The intermediate storage plate 620 and the conductive landing pad 610 may be formed of W.

Between the storage plate 120 and the first conductive path MW1 of the wiring structure MWS, the first contact plug 142, the conductive landing pad 610, and an upper contact plug 642 may be arranged. The upper contact plug 642 may longitudinally extend in a position spaced apart from the upper capacitor block CB6B in the horizontal direction through the second insulating layer 122 and the third insulating layer 140 in the vertical direction (the Z direction). The upper contact plug 642 may be formed of W. The first contact plug 142 may have a bottom surface that contacts the storage plate 120 and an upper surface that contacts the conductive landing pad 610 and the upper contact plug 642 may have a bottom surface that contacts the conductive landing pad 610 and an upper surface that contacts the wiring layer 152 included in the wiring structure MWS. The storage plate 120 may be connected to the first conductive pad 172 through the first contact plug 142, the conductive landing pad 610, the upper contact plug 642, and the first conductive path MW1 of the wiring structure MWS.

Figure 7:
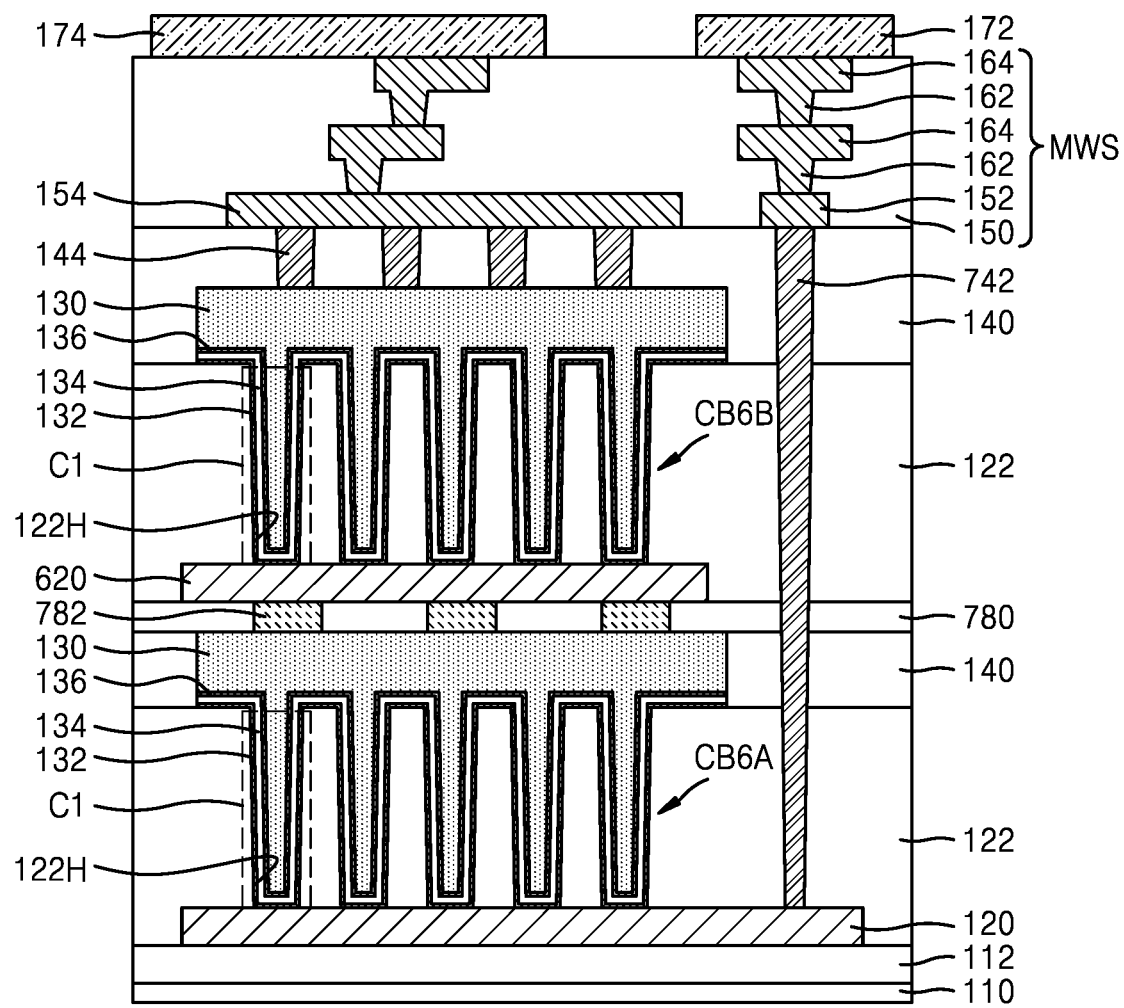
FIG. 7 is a cross-sectional view illustrating a decoupling capacitor according to other embodiments of the inventive concept.
Figure 7:
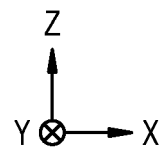

FIG. 7 is a cross-sectional view illustrating a decoupling capacitor 700 according to other embodiments of the inventive concept.

The decoupling capacitor 700 may have almost the same configuration as the decoupling capacitor 600 described with reference to FIG. However, the decoupling capacitor 700 may include an intermediate insulating layer 780 interposed between the top plate 130 that contacts the upper electrode 136 of the lower capacitor block CB6A and the intermediate storage plate 620, and a plurality of conductive adhesive layers 782 that pass through the intermediate insulating layer 780. The top plate 130 that contacts the upper electrode 136 of the lower capacitor block CB6A and the intermediate storage plate 620 may be configured to be electrically connected to each other through the plurality of conductive adhesive layers 782. The plurality of conductive adhesive layers 782 may be formed of copper (Cu). The intermediate insulating layer 780 may be formed of an oxide layer, a nitride layer, or a combination of the above layers.

Between the storage plate 120 and the first conductive path MW1 of the wiring structure MWS, a first contact plug 742 may be arranged. The first contact plug 742 may longitudinally extend in a position spaced apart from the lower capacitor block CB6A and the upper capacitor block CB6B in the horizontal direction through a plurality of second insulating layers 122, a plurality of third insulating layers 140, and the intermediate insulating layer 780 in the vertical direction (the Z direction). The first contact plug 742 may be formed of W. The first contact plug 742 may have a bottom surface that contacts the storage plate 120 and an upper surface that contacts the wiring layer 152 included in the wiring structure MWS. The storage plate 120 may be connected to the first conductive pad 172 through the first contact plug 742 and the first conductive path MW1 of the wiring structure MWS.

Since each of the foregoing decoupling capacitors 100, 200A, 200B, 300, 400, 500, 600, and 700 described with reference to FIGS. 1A through 7 includes a plurality of capacitor structures arranged with a small pitch and high density, a small and thin structure may be implemented and yet a resulting capacitance per unit area may be remarkably increased.

Next, exemplary methods of manufacturing for the discrete decoupling capacitors according to embodiments of the inventive concept will be described in some additional detail.

FIGS. 8 through 13 (each FIG. respectively including an 'A' plan perspective and a 'B' cross-sectional perspective) are respective views variously illustrating aspects of a method of manufacturing a decoupling capacitor according to embodiments of the inventive concept. FIGS. 8A, 9A, 10A, 11A, 12A and 13A are plan views and FIGS. 8B, 9B, 10B, 11B, 12B and 13B are related cross-sectional views taken along the line A-A' of the plan views FIGS. 8A, 9A, 10A, 11a, 12A and 13A.

Figure 8A:
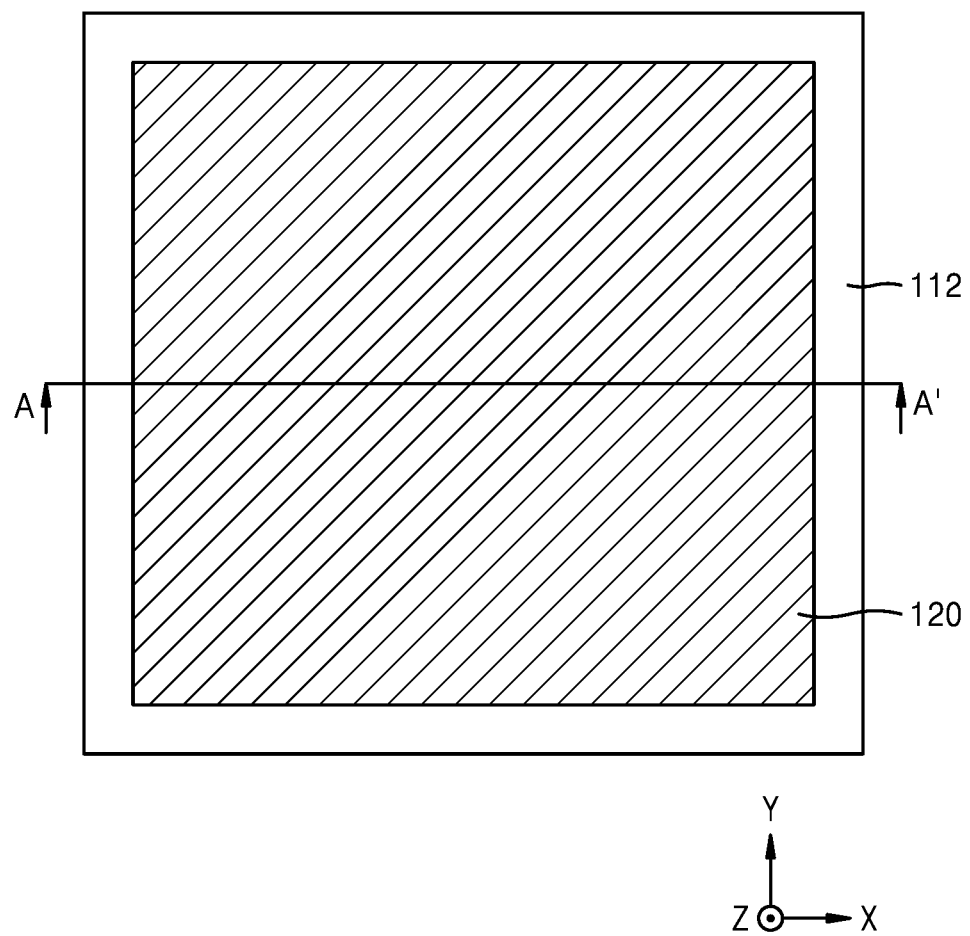
FIGS. 8A, 9A, 10A, 11A, 12A and 13A are plan views
Figure 8B:
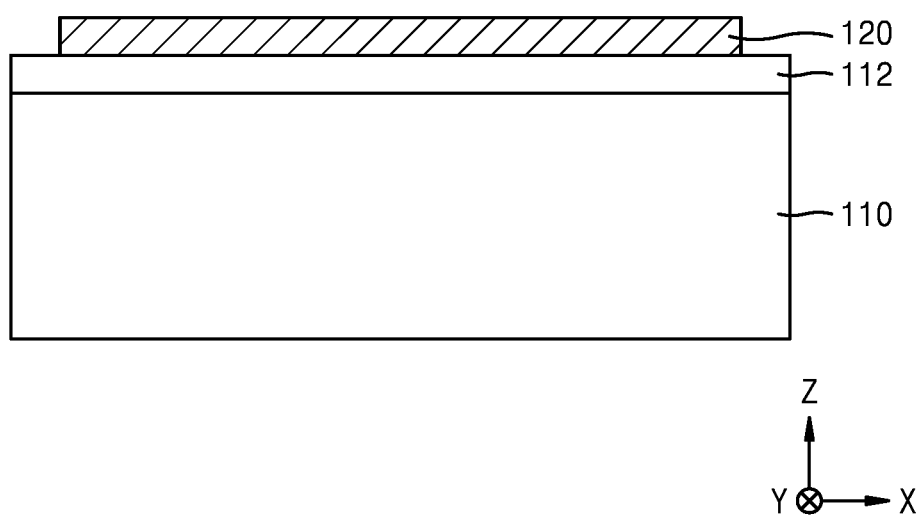
FIGS. 8B, 9B, 10B, 11B, 12B and 13B are related cross-sectional views taken along the line A-A' of the plan views FIGS. 8A, 9A, 10A, 11a, 12A and 13A.

Referring to FIGS. 8A and 8B, the first insulating layer 112 is formed on the substrate 110 and the storage plate 120 is formed on the first insulating layer 112. The substrate 110 may have a thickness greater than that of the substrate 110 of the decoupling capacitor 100 illustrated in FIG. 1A.

Figure 9A:
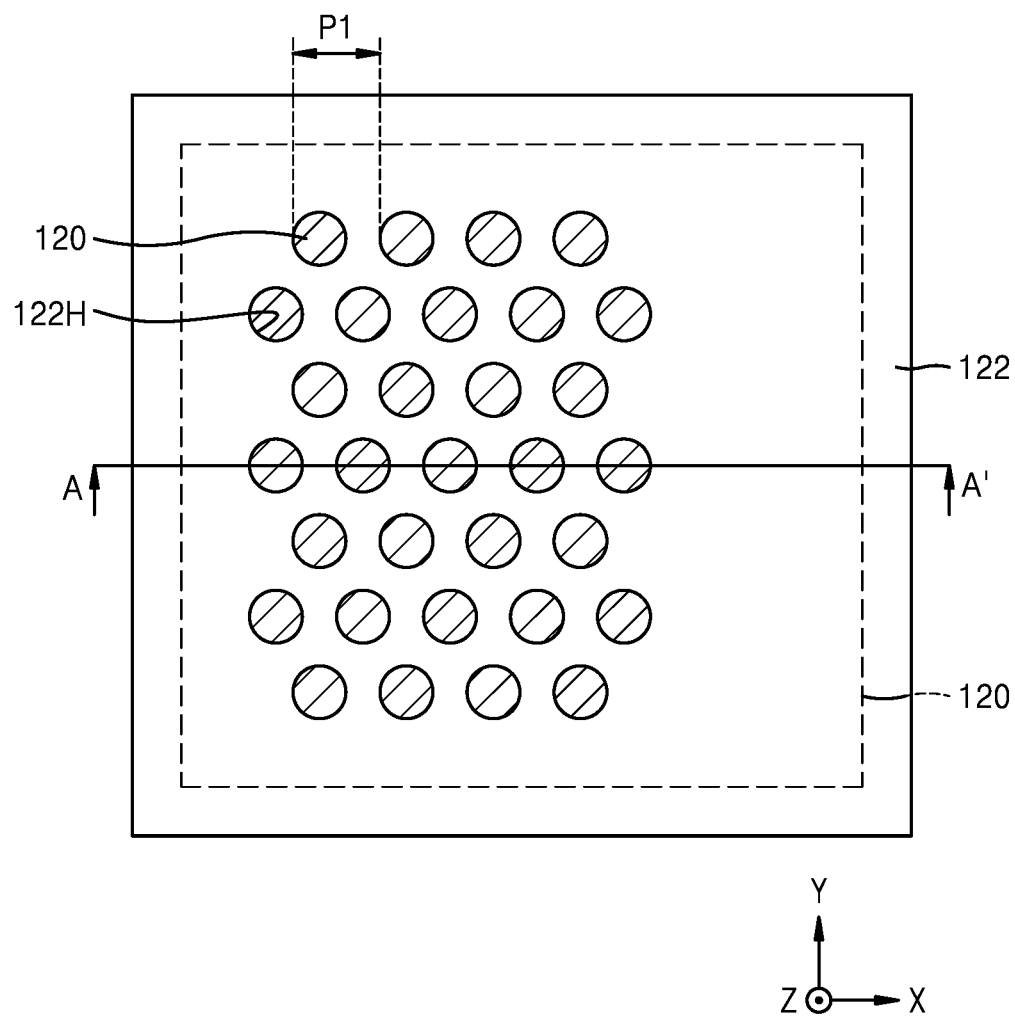
Figure 9B:
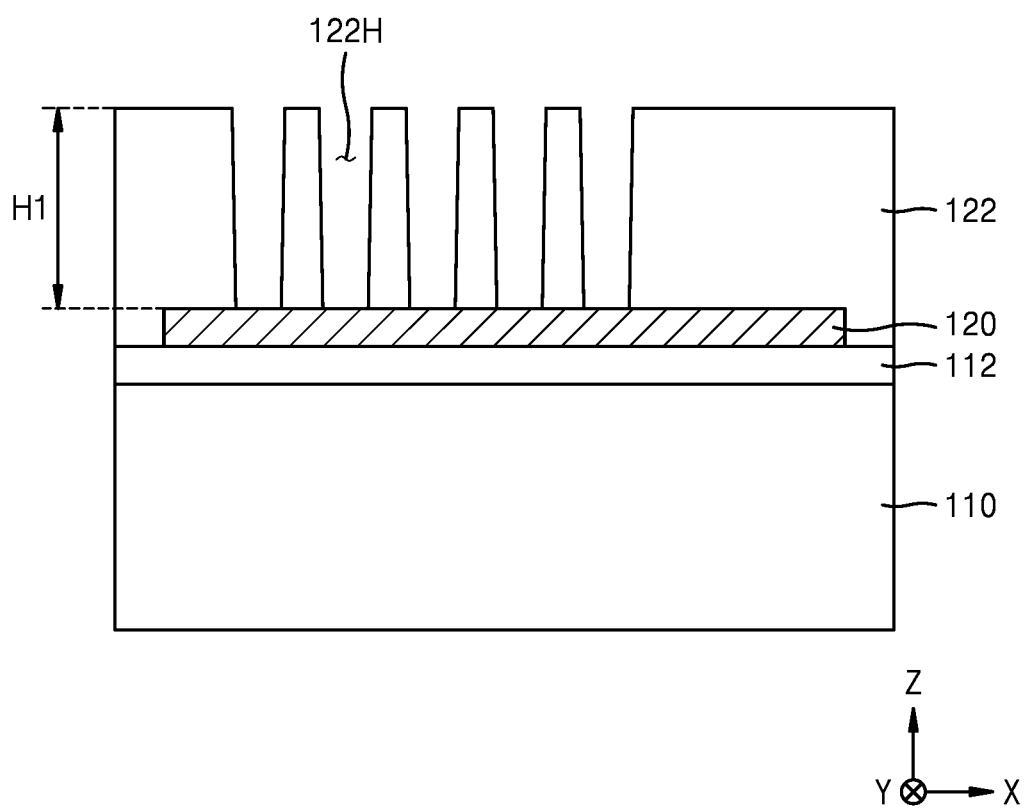

Referring to FIGS. 9A and 9B, the second insulating layer 122 that covers the first insulating layer 112 and the storage plate 120 is formed, the plurality of through holes 122H are formed in the second insulating layer 122 by using a photolithography process, and partial regions of the storage plate 120 are exposed through the plurality of through holes 122H. The plurality of through holes 122H may each have a vertical height H1 (in the Z direction) ranging from about 1 μm to about 2 μm, and may be arranged with a pitch P1 ranging from about 80 nm to about 150 nm. For example, the plurality of through holes 122H may each have a height H1 of about 1.5 μm and may be arranged with a pitch P1 of about 120 nm.

Figure 10A:
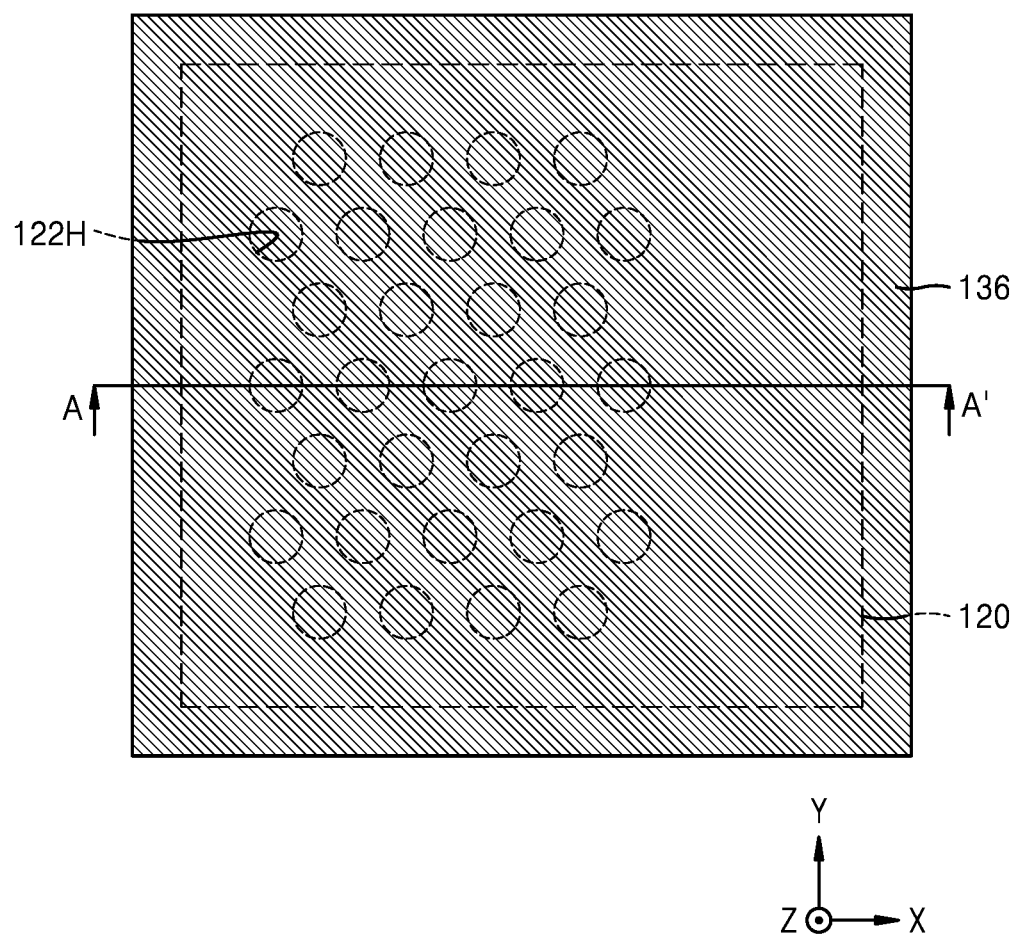
Figure 10B:
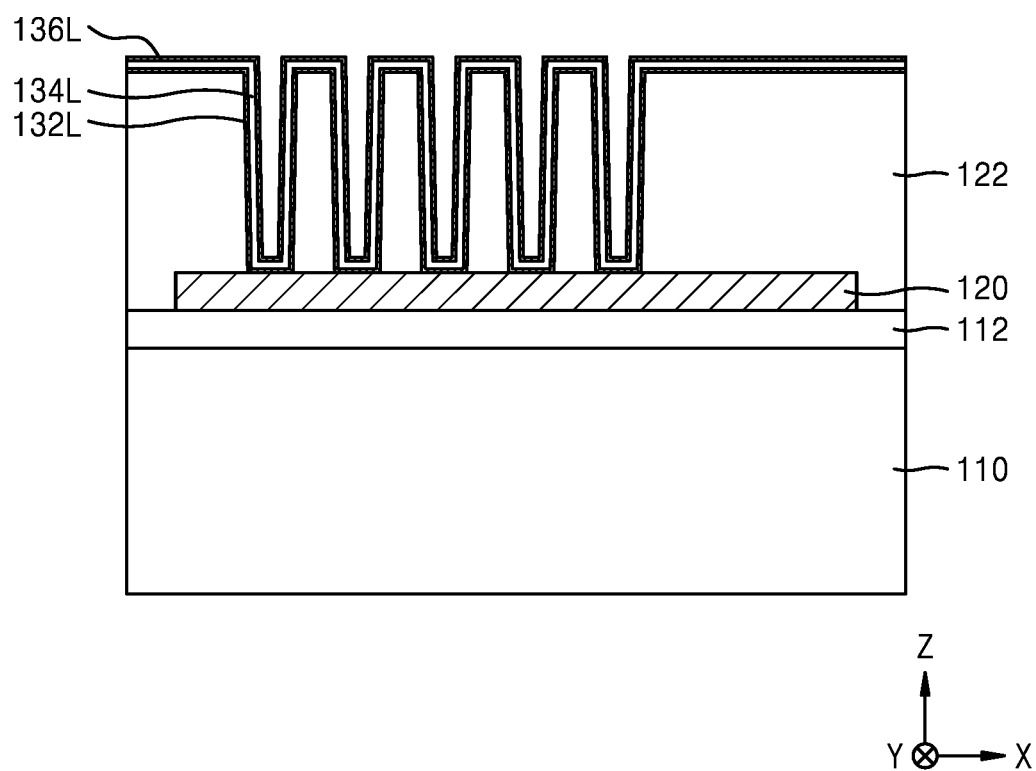

Referring to FIGS. 10A and 10B, a lower electrode layer 132L, a preliminary dielectric layer 134L, and an upper electrode layer 136L are sequentially formed on the resultant material of FIGS. 9A and 9B. After the upper electrode layer 136L is formed, in each of the plurality of through holes 122H, an empty space may remain on the upper electrode layer 136L.

The respective material(s) forming the lower electrode layer 132L, the preliminary dielectric layer 134L, and the upper electrode layer 136L may be the same as those forming the lower electrode 132, the dielectric layer 134, and the upper electrode 136, as described above in relation to FIGS. 1A and 1B.

Figure 11A:
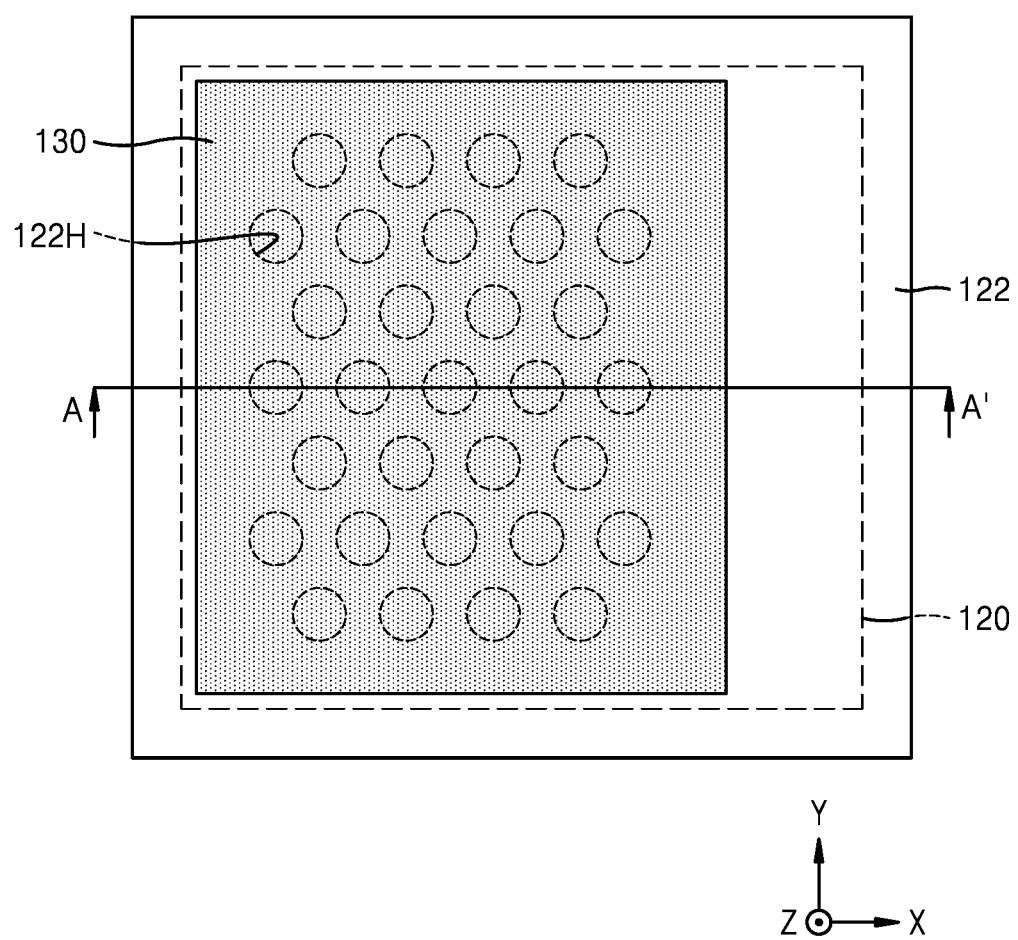
Figure 11B:
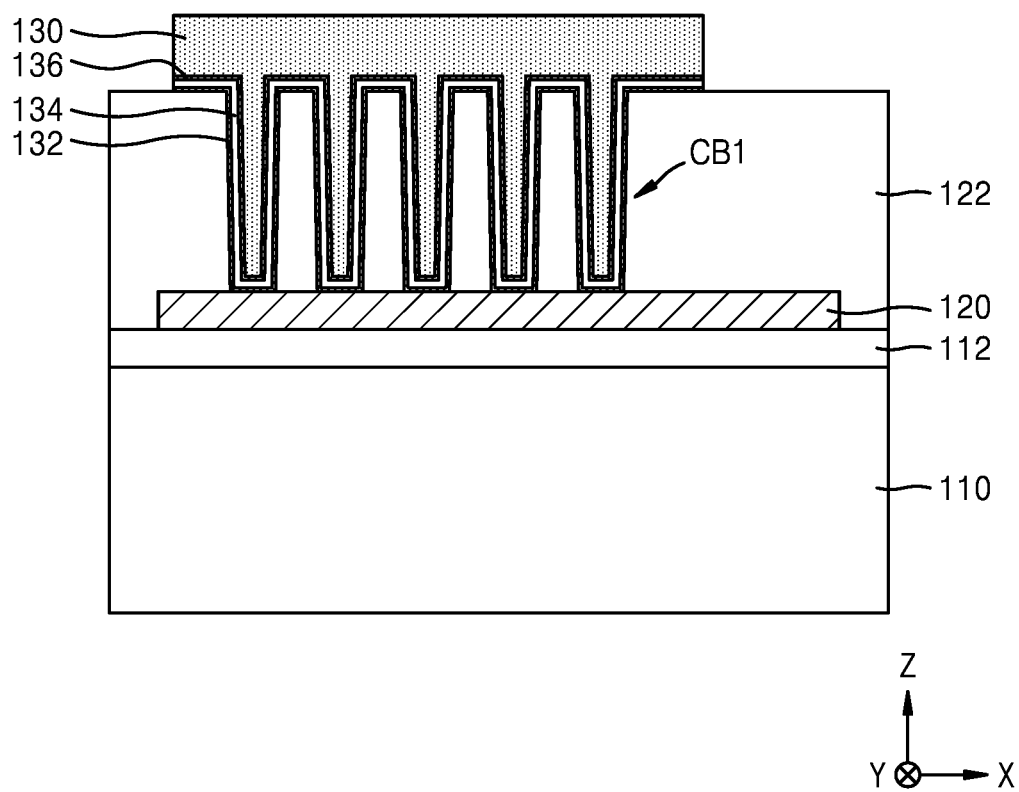

Referring to FIGS. 11A and 11B, a conductive semiconductor material layer for forming the top plate 130 is formed on the resultant material of FIGS. 10A and 10B. The conductive semiconductor material layer may cover the upper electrode layer 136L on the second insulating layer 122 while filling the void (i.e., empty space) of each of the plurality of through holes 122H in the resultant material of FIGS. 10A and 10B. Then, by patterning the conductive semiconductor material layer and the lower electrode layer 132L, the preliminary dielectric layer 134L, and the upper electrode layer 136L thereunder, the top plate 130, the lower electrode 132, the dielectric layer 134, and the upper electrode 136 that are formed of a remaining portion of the conductive semiconductor material layer are formed.

Figure 12A:
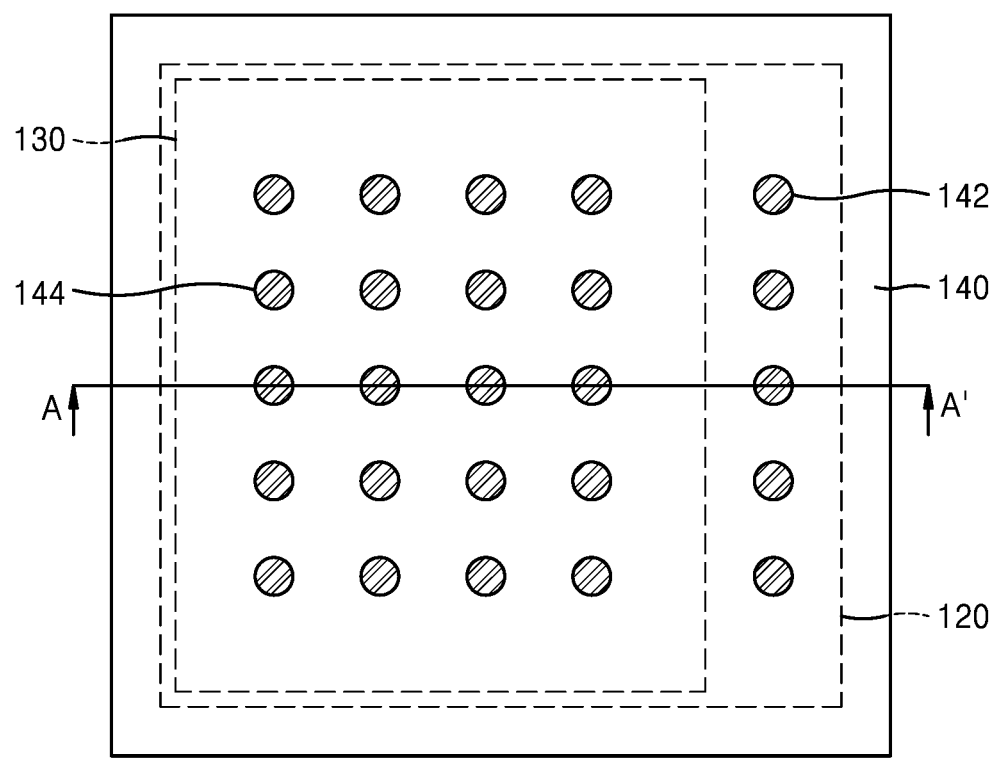
Figure 12B:
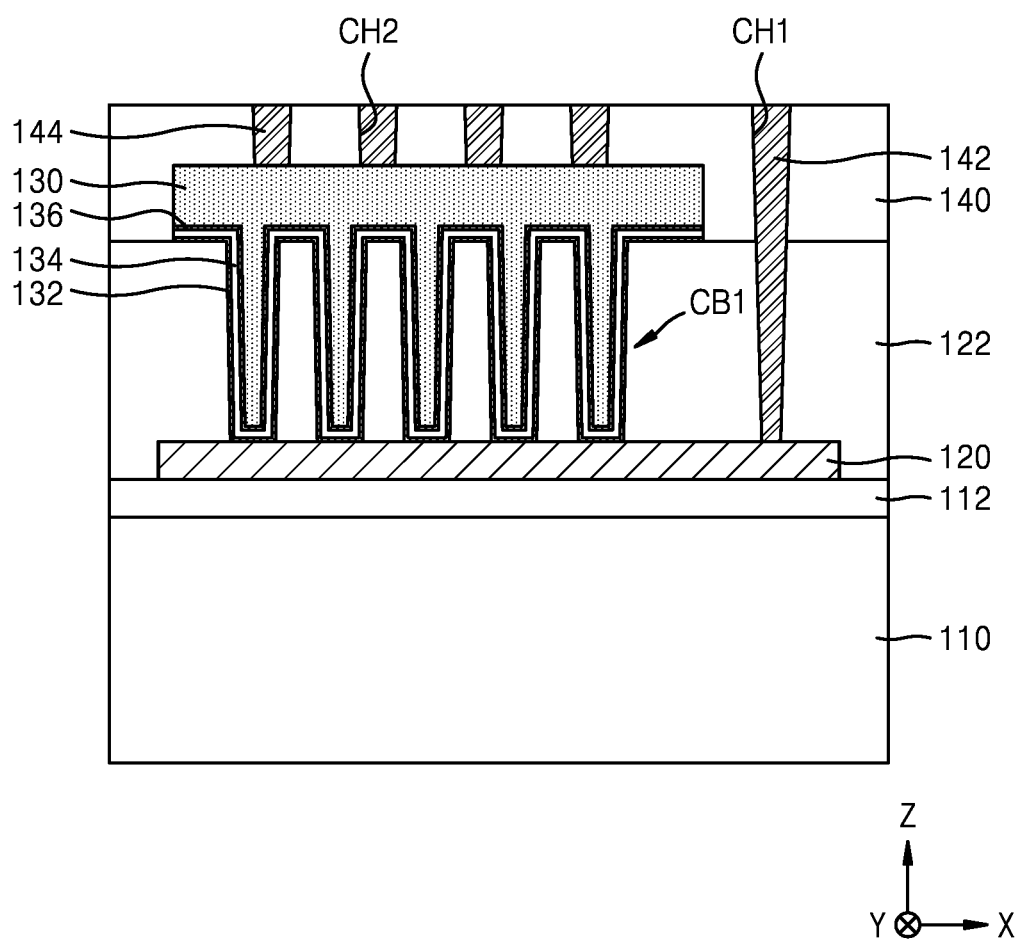

Referring to FIGS. 12A and 12B, after forming the third insulating layer 140 that covers the resultant material of FIGS. 11A and 11B, by forming a plurality of contact holes CH1 and CH2 that pass through the third insulating layer 140 and the second insulating layer 122 and filling the plurality of contact holes CH1 and CH2 with a conductive material, the plurality of first contact plugs 142 and the plurality of second contact plugs 144 are formed.

Figure 13A:
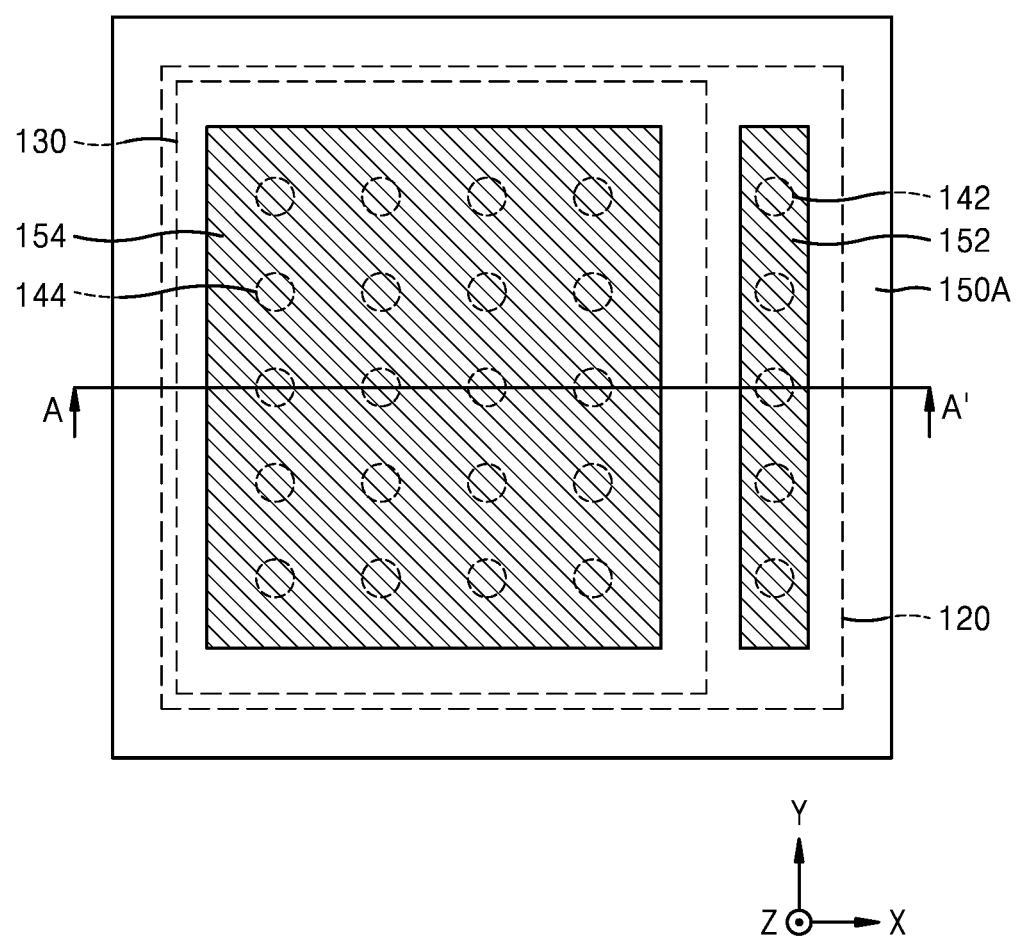
Figure 13B:
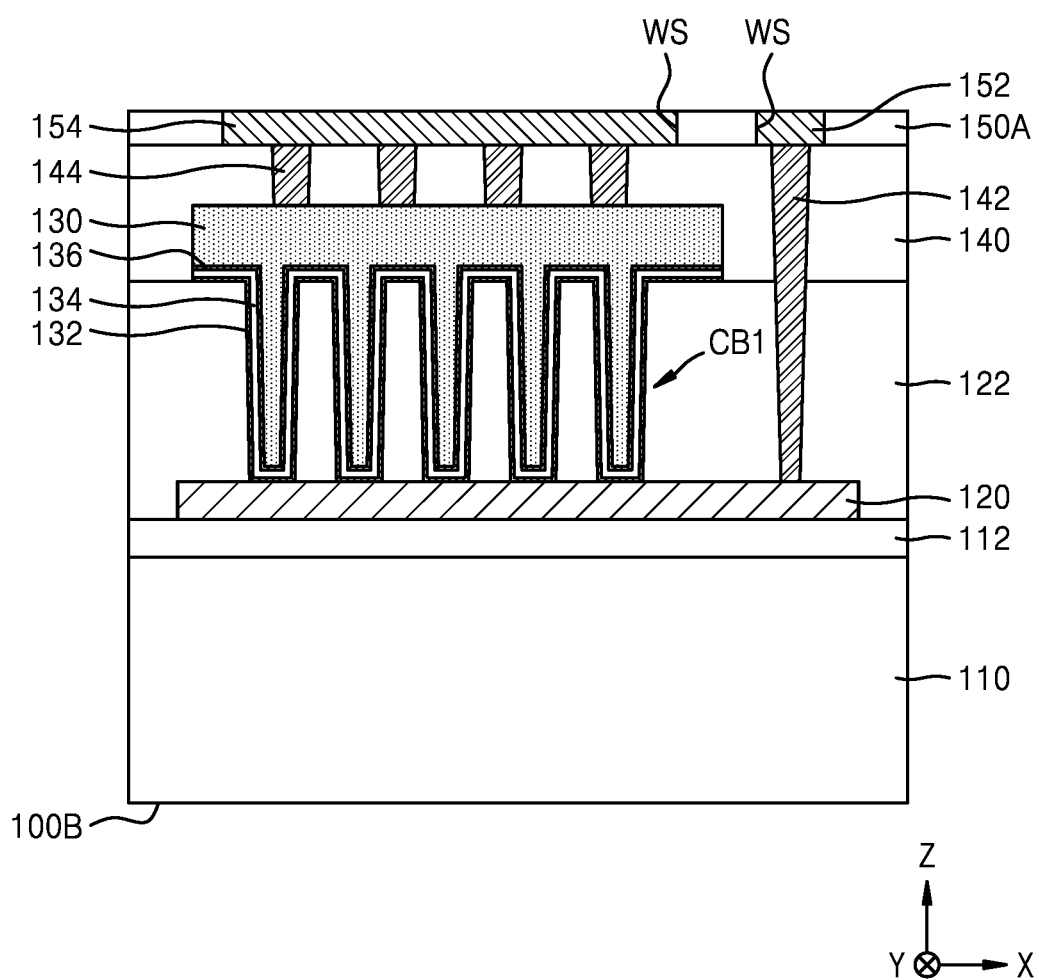

Referring to FIGS. 13A and 13B, after forming a metal interlayer insulating layer 150A that covers the resultant material of FIGS. 12A and 12B and forming a plurality of wiring spaces WS by etching a partial region of the metal interlayer insulating layer 150A, by filling the plurality of wiring spaces WS with a conductive material, the plurality of wiring layers 152 and 154 are formed. In exemplary embodiments, in order to form the plurality of wiring layers 152 and 154, a damascene process may be used.

Then, the wiring structure MWS illustrated in FIG. 1A may be formed by repeating processes similar to a process of forming the metal interlayer insulating layer 150A and the plurality of wiring layers 152 and 154 a plurality of number of times, the first conductive pad 172 and the second conductive pad 714 may be formed on the wiring structure MWS, and the decoupling capacitor 100 illustrated in FIGS. 1A and 1B may be manufactured by polishing the substrate 110 from the bottom surface 110B of the substrate 110. In exemplary embodiments, unlike the decoupling capacitor 100 illustrated in FIGS. 1A and 1B, by completely removing the substrate 110 from the resultant material of FIGS. 13A and 13B, the first insulating layer 112 may be exposed.

Figure 14A:
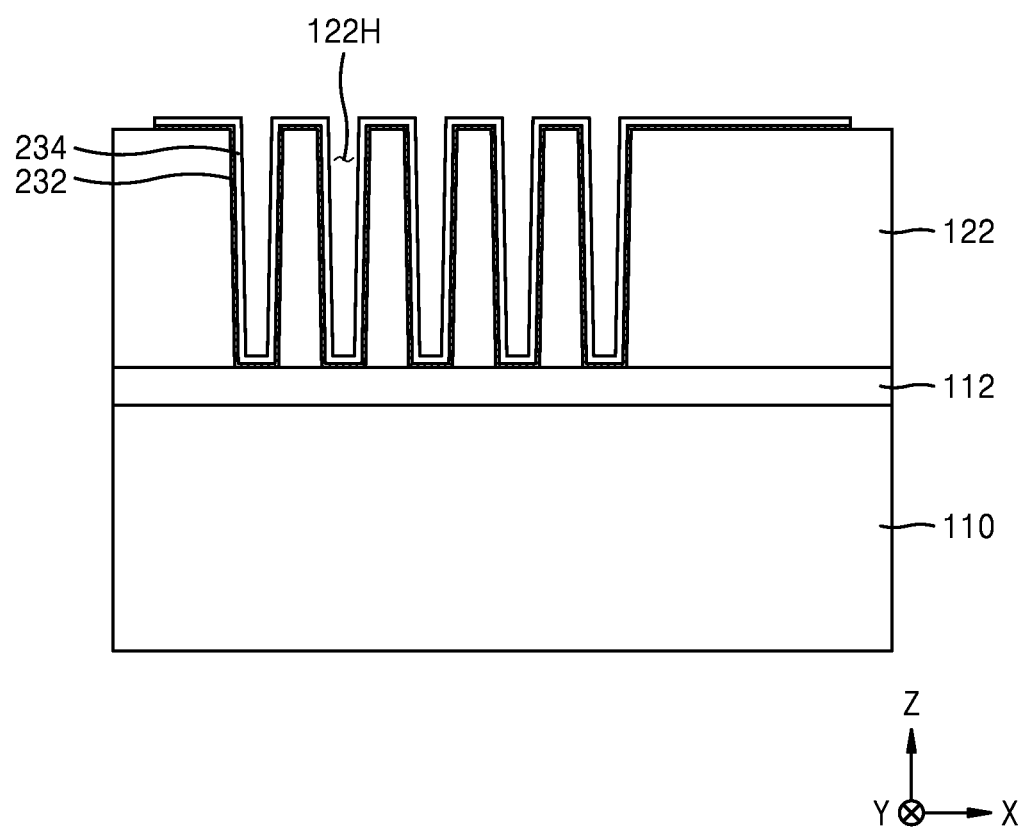
FIGS. 14A, 14B and 14C are cross-sectional views sequentially illustrating processes of a method of manufacturing a decoupling capacitor according to other embodiments of the inventive concept.
Figure 14B:
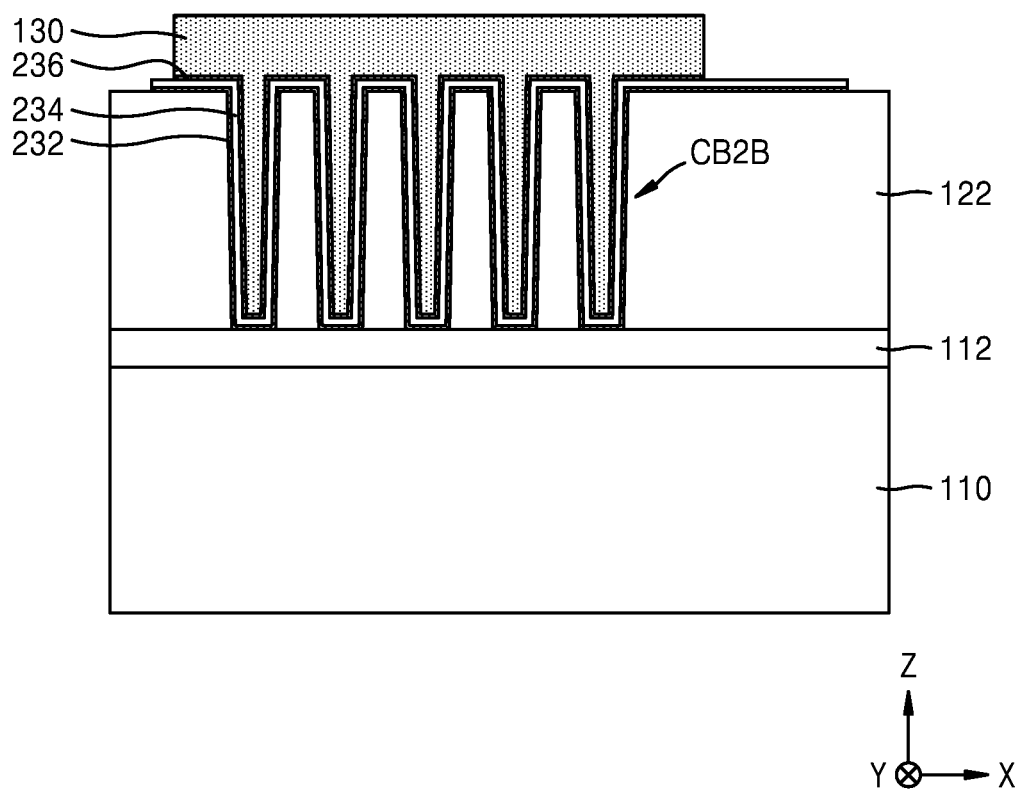
Figure 14C:
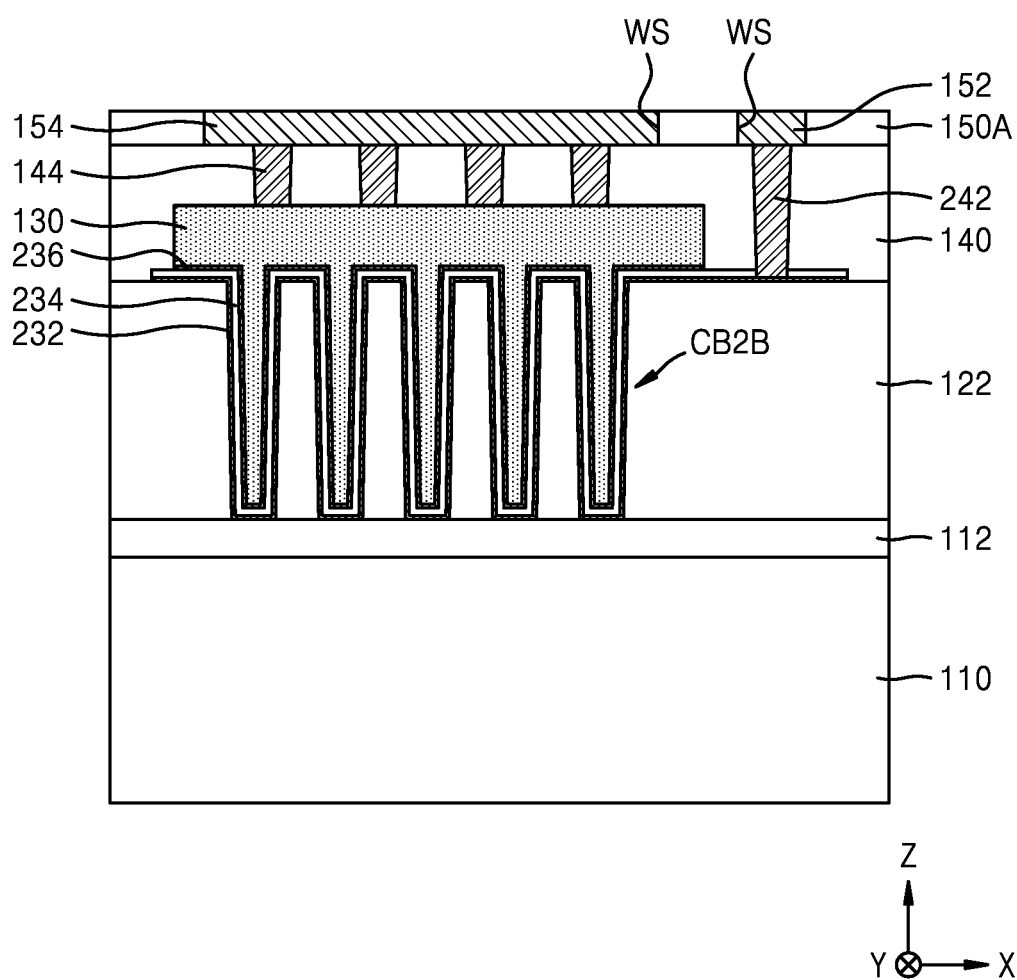

FIGS. 14A, 14B and 14C are respective cross-sectional views sequentially illustrating a method of manufacturing a decoupling capacitor 200B according to other embodiments of the inventive concept. Referring to FIGS. 14A, 14B and 14C, a method of manufacturing the decoupling capacitor 200B of FIG. 2B is described, as a representative example.

Referring to FIG. 14A, after the first insulating layer 112 is formed on the substrate 110 by a method similar to that described with reference to FIGS. 8A and 8B, the second insulating layer 122 having the plurality of through holes 122H is formed on the first insulating layer 112 by a method similar to that described with reference to FIGS. 9A and 9B and the lower electrode layer 132L and the preliminary dielectric layer 134L that cover internal walls of the plurality of through holes 122H and the upper surface of the second insulating layer 122 are sequentially formed by a method similar to that described with reference to FIGS. 10A and 10B. In the current example, unlike in the process described with reference to FIGS. 8A and 8B, a process of forming the storage plate 120 on the first insulating layer 112 is omitted. Then, by patterning the lower electrode layer 132L and the preliminary dielectric layer 134L, the lower electrode 232 and the dielectric layer 234 are formed.

Referring to FIG. 14B, by a method similar to that described with reference to FIGS. 10A and 10B, the upper electrode layer 136L is formed on the resultant material of FIG. 14A. Then, the conductive semiconductor material layer for forming the top plate 130 is formed on the upper electrode layer 136L by a method similar to that described with reference to FIGS. 11A and 11B and the top plate 130 and the upper electrode 236 are formed by patterning the conductive semiconductor material layer and the upper electrode layer 136L thereunder. After the top plate 130 and the upper electrode 236 are formed, around the top plate 130, an upper surface of the dielectric layer 234 may be exposed.

Referring to FIG. 14C, after the third insulating layer 140 that covers the resultant material of FIG. 14B is formed by a method similar to that described with reference to FIGS. 12A and 12B, a plurality of first contact plugs 242 and the plurality of second contact plugs 144 that pass through the third insulating layer 140 are formed. Then, by a method similar to that described with reference to FIGS. 13A and 13B, the metal interlayer insulating layer 150A and the plurality of wiring layers 152 and 154 are formed.

Then, the wiring structure MWS may be formed by repeating processes similar to a process of forming the metal interlayer insulating layer 150A and the plurality of wiring layers 152 and 154 a plurality of times and the decoupling capacitor 200B illustrated in FIG. 2B may be manufactured by forming the first conductive pad 172 and the second conductive pad 174 on the wiring structure MWS.

Figure 15A:
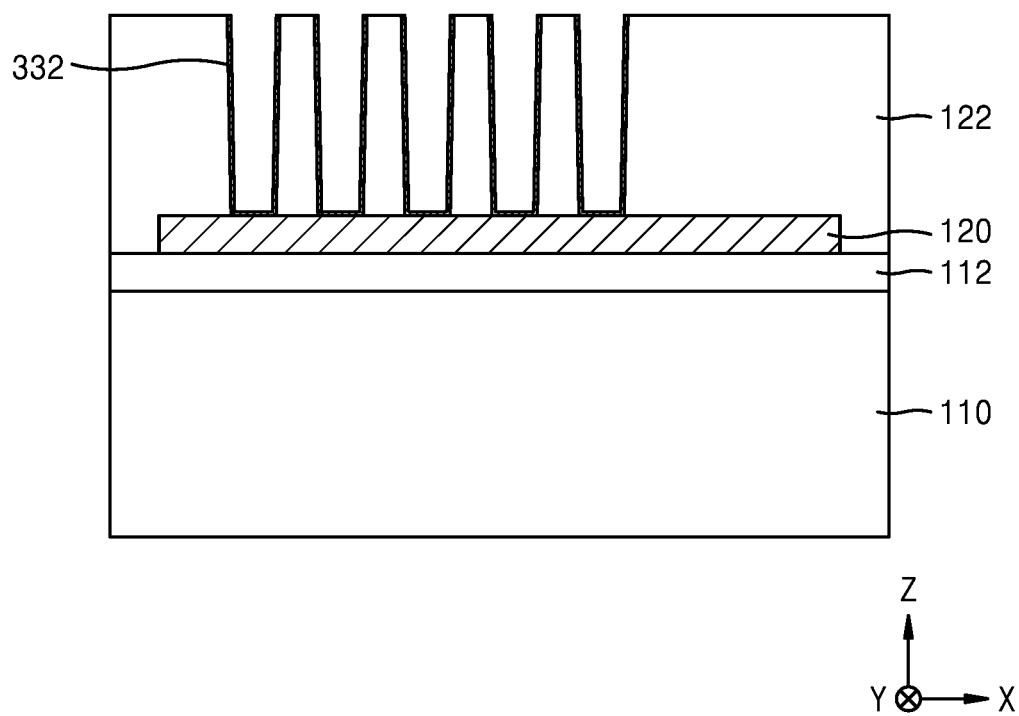
FIGS. 15A and 15B are cross-sectional views sequentially illustrating processes of a method of manufacturing a decoupling capacitor according to other embodiments of the inventive concept.
Figure 15B:
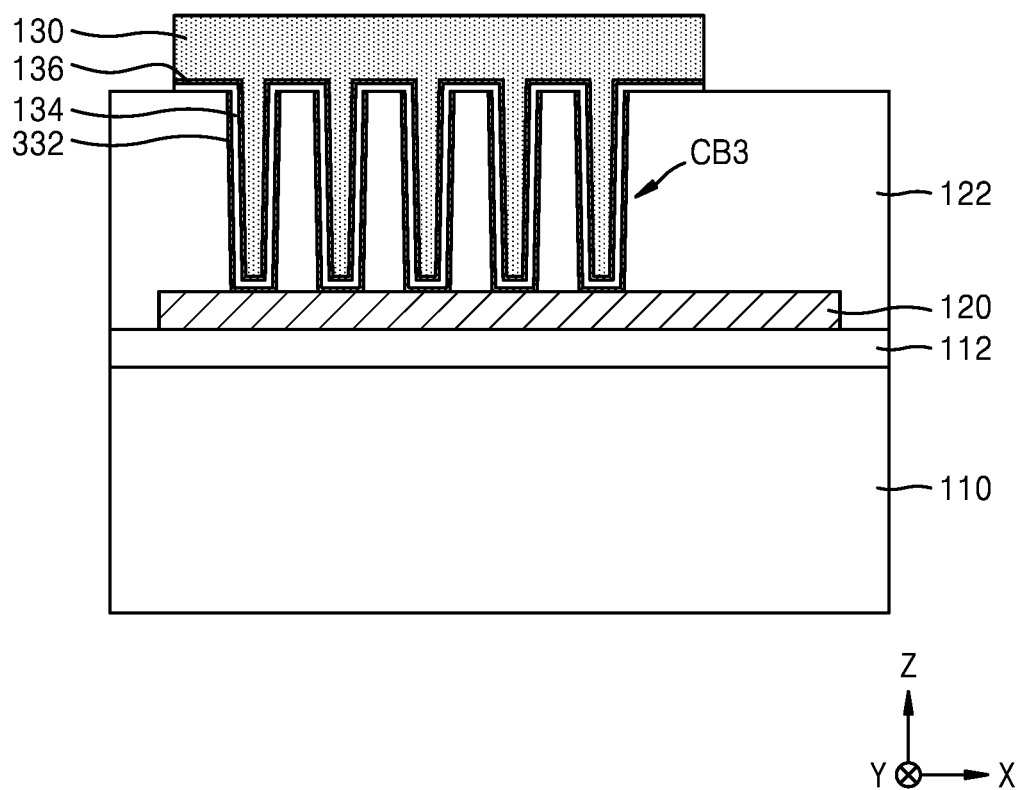

FIGS. 15A and 15B are cross-sectional views illustrating processes of a method of manufacturing a decoupling capacitor according to other embodiments of the inventive concept in order. Referring to FIGS. 15A and 15B, a method of manufacturing the decoupling capacitor 300 illustrated in FIG. 3 is described, as a representative example.

Referring to FIG. 15A, the first insulating layer 112, the storage plate 120, and the second insulating layer 122 including and the plurality of through holes 122H may be formed on the substrate 110 by a method similar to that described with reference to FIGS. 8A to 10B and the lower electrode layer 132L (refer to FIG. 10B) that covers the internal walls of the plurality of through holes 122H and the upper surface of the second insulating layer 122 is formed. Then, by removing a part of the lower electrode layer 132L, the upper surface of the second insulating layer 122 is exposed. As a result, in the plurality of through holes 122H, the lower electrodes 332 formed of remaining portions of the lower electrode layer 132L may remain.

Referring to FIG. 15B, the preliminary dielectric layer 134L and the upper electrode layer 136L are formed on the resultant material of FIG. 15A by a method similar to that described with reference to FIGS. 10A and 10B, the conductive semiconductor material layer for forming the top plate 130 is formed on the upper electrode layer 136L by a method similar to that described with reference to FIGS. 11A and 11B, and the top plate 130, the upper electrode 136, and the dielectric layer 134 are formed by patterning the conductive semiconductor material layer and the upper electrode layer 136L and the preliminary dielectric layer 134L thereunder.

Then, by performing processes described with reference to FIGS. 12A, 12B, 13A and 13B, the decoupling capacitor 300 illustrated in FIG. 3 may be manufactured.

Exemplary methods of manufacturing the decoupling capacitors 100, 200B, and 300 are described with reference to FIGS. 8 through 13, 14A, 14B, 14C, 15A and 15B. However, those skilled in the art will recognize that the decoupling capacitors 200A, 400, 500, 600, and 700 illustrated in FIGS. 2A, 4, 5, 6 and 7 may be readily manufactured using various modifications to the foregoing.

Figure 16:
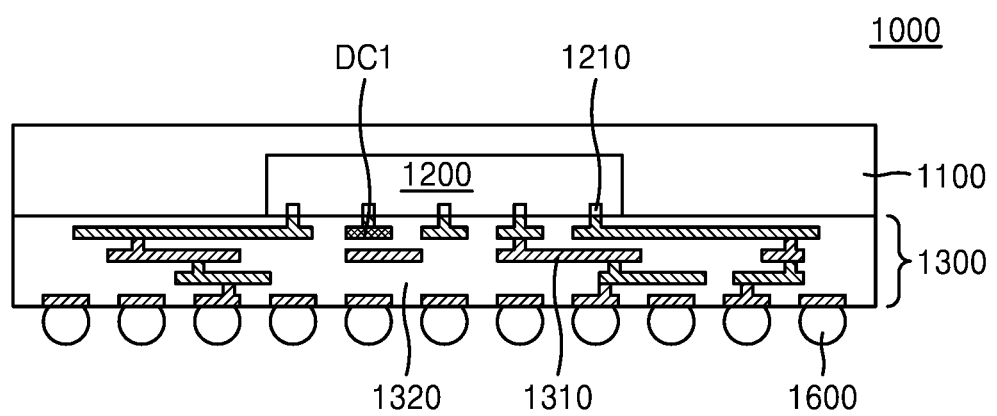
FIG. 16 is a cross-sectional view illustrating an integrated circuit chip package according to embodiments of the inventive concept.

FIG. 16 is a cross-sectional view illustrating an integrated circuit chip package 1000 according to embodiments of the inventive concept.

Referring to FIG. 16, the integrated circuit chip package 1000 includes a mold substrate 1100 and a semiconductor chip 1200 mounted in the mold substrate 1100. The semiconductor chip 1200 may include an integrated circuit. In exemplary embodiments, the semiconductor chip 1200 may be a logic chip including a logic circuit. The logic chip may be a controller for controlling memory chips. In other exemplary embodiments, the semiconductor chip 1200 may be a memory chip. The memory chip may include a memory circuit in one of various forms. The memory circuit may be formed of dynamic random access memory (DRAM), static RAM (SRAM), ferromagnetic RAM (FRAM), phase change RAM (PRAM), magnetic RAM (MRAM), resistive RAM (RRAM), read only memory (ROM), mask ROM (MROM), programmable ROM (PROM), erasable ROM (EPROM), electrically erasable ROM (EEPROM), or a combination of the above memories.

A redistribution structure 1300 is formed on the mold substrate 1100. The redistribution structure 1300 may include a plurality of wiring layers 1310 configured to be electrically connected to a plurality of chip pads 1210 included in the semiconductor chip 1200 and an insulating layer 1320 for selectively insulating a plurality of adjacent wiring layers 1310 from each other among the plurality of wiring layers 1310. The plurality of wiring layers 1310 included in the redistribution structure 1300 may include Al, Cu, Sn, nickel (Ni), gold (Au), platinum (Pt), or an alloy of the above metals. A plurality of external connection members 1600 may be connected to the redistribution structure 1300.

The redistribution structure 1300 may further include a decoupling capacitor DC1. The decoupling capacitor DC1 may be electrically connected to partial chip pads 1210 among the plurality of chip pads 1210 included in the semiconductor chip 1200 or partial wiring layers 1310 selected from the plurality of wiring layers 1310 included in the redistribution structure 1300. The decoupling capacitor DC1 may include one selected from the decoupling capacitors 100, 200A, 200B, 300, 400, 500, 600, and 700 described with reference to FIGS. 1A to 7 and decoupling capacitors having various modified and changed structures within the scope of the inventive concept.

Figure 17:
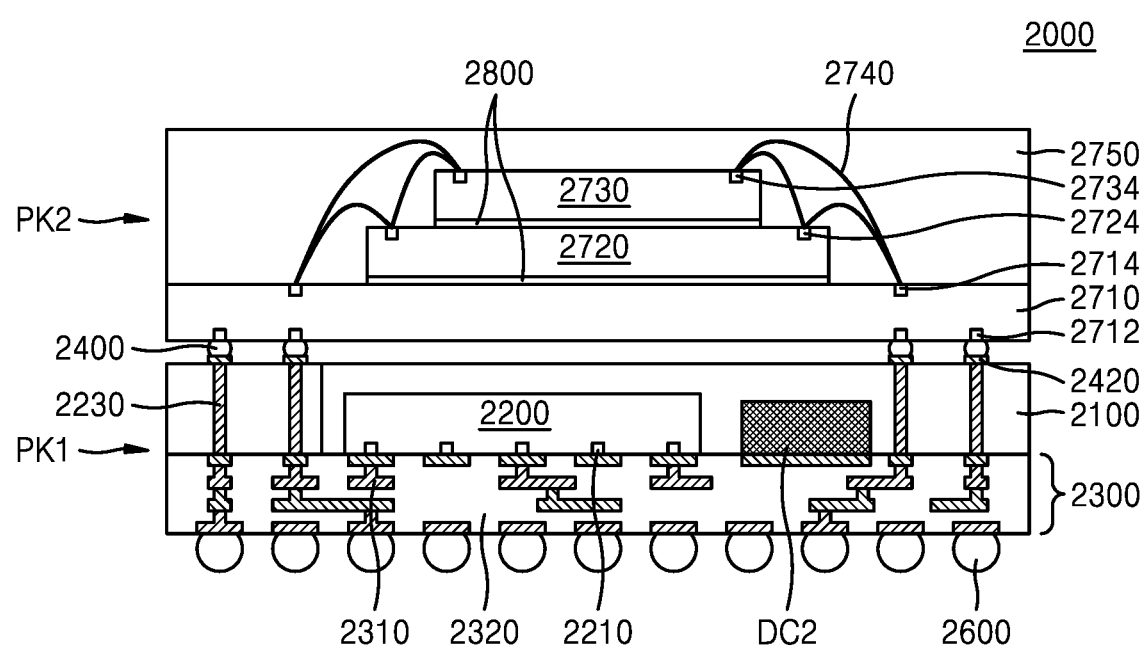
FIG. 17 is a cross-sectional view illustrating an integrated circuit chip package according to other embodiments of the inventive concept.

FIG. 17 is a cross-sectional view illustrating an integrated circuit chip package 2000 according to other embodiments of the inventive concept.

Referring to FIG. 17, the integrated circuit chip package 2000 may include a first package PK1 and a second package PK2 stacked to overlap each other in the vertical direction. The first package PK1 and the second package PK2 may be connected to each other through a plurality of conductive connection members 2400.

The first package PK1 may include a mold substrate 2100, a first semiconductor chip 2200 mounted in the mold substrate 2100, and a decoupling capacitor DC2. A more detailed configuration of first semiconductor chip 2200 is the same as that of the semiconductor chip 1200 described with reference to FIG. 16. The decoupling capacitor DC2 may include one selected from the decoupling capacitors 100, 200A, 200B, 300, 400, 500, 600, and 700 described with reference to FIGS. 1A to 7 and decoupling capacitors having various modified and changed structures within the scope of the inventive concept.

On the mold substrate 2100, a redistribution layer 2300 may be formed. The redistribution layer 2300 may include a plurality of wiring layers 2310 configured to be electrically connected to a plurality of chip pads 2210 included in the first semiconductor chip 2200 and an insulating layer 2320 for selectively insulating adjacent wiring layers 2310 from each other among the plurality of wiring layers 2310. The plurality of wiring layers 2310 included in the redistribution layer 2300 may include Al, Cu, Sn, Ni, Au, Pt, or an alloy of the above metals. The first package PK1 may further include a plurality of external connection members 2600 arranged on the redistribution layer 2300.

The first package PK1 may further include a plurality of through electrodes 2230 that pass through at least a part of the mold substrate 2100.

The second package PK2 may include a package substrate 2710, a second semiconductor chip 2720 and a third semiconductor chip 2730 mounted on the package substrate 2710, and a sealing member 2750 that covers the second semiconductor chip 2720 and the third semiconductor chip 2730 on the package substrate 2710.

The second package PK2 may be connected to the first package PK1 through the plurality of conductive connection members 2400 formed on the mold substrate 2100. The plurality of conductive connection members 2400 may be formed of solder balls or conductive pumps. The plurality of conductive connection members 2400 may be arranged between redistribution layers 2420 provided on the plurality of through electrodes 2230 and connection pads 2712 of the package substrate 2710.

The second semiconductor chip 2720 and the third semiconductor chip 2730 may be mounted on the package substrate 2710 by adhesive members 2800. Chip pads 2724 of the second semiconductor chip 2720 and chip pads 2734 of the third semiconductor chip 2730 may be connected to connection pads 2714 of the package substrate 2710 through bonding wires 2740.

In FIG. 17, a case in which the second package PK2 includes two semiconductor chips, that is, the second semiconductor chip 2720 and the third semiconductor chip 2730 mounted by a wire bonding method is illustrated. However, the number of semiconductor chips included in the second package PK2 and the method of mounting the semiconductor chips included in the second package PK2 are not limited thereto and may be variously modified and changed by those skilled in the art.

The integrated circuit chip packages 1000 and 2000 according to the embodiments of the inventive concept include the decoupling capacitors DC1 and DC2 including a plurality of capacitor structures arranged with a small pitch and high density. Therefore, without increasing sizes and thicknesses of the integrated circuit chip packages 1000 and 2000, the decoupling capacitors DC1 and DC2 may be mounted in desired positions in the integrated circuit chip package. Therefore, the integrated circuit chip package according to the inventive concept may be advantageously applied to a high speed and frequency product that may provide desired electrical characteristics and has a desired small thickness.

While the inventive concept has been particularly shown and described with reference to certain embodiments, it will be understood that various changes in form and details may be made therein without departing from the spirit and scope of the following claims.

What is claimed is:

1. A discrete decoupling capacitor comprising:
a first insulating layer extending in a horizontal direction;
a storage plate arranged on the first insulating layer;
a top plate spaced apart from the storage plate in a vertical direction and facing the storage plate;
a second insulating layer interposed between the storage plate and the top plate and having a plurality of through holes;
a capacitor block including a plurality of capacitor structures respectively formed in the plurality of through holes;
a third insulating layer covering a top surface and side surfaces of the top plate and on the second insulating layer;
a wiring structure on the third insulating layer,
the wiring structure having a top surface and an opposing bottom surface, and comprising respective first and second conductive paths both extending from the top surface through to the bottom surface of the wiring structure;
a first conductive pad arranged on the top surface of the wiring structure and electrically connected to the storage plate through the first conductive path of the wiring structure; and
a second conductive pad spaced apart from the first conductive pad in the horizontal direction, arranged on the top surface of the wiring structure in a same horizontal plane as the first conductive pad, and electrically connected to the top plate through the second conductive path of the wiring structure.

2. The discrete decoupling capacitor of claim 1, wherein the plurality of capacitor structures comprises a lower electrode contacting the storage plate in the plurality of through holes, an upper electrode contacting the top plate in the plurality of through holes, and a dielectric layer interposed between the lower electrode and the upper electrode.

3. The discrete decoupling capacitor of claim 1, wherein the plurality of capacitor structures shares one dielectric layer and one upper electrode.

4. The discrete decoupling capacitor of claim 1, wherein the plurality of capacitor structures shares one lower electrode, one dielectric layer, and one upper electrode.

5. The discrete decoupling capacitor of claim 1, wherein the top plate comprises a first portion extending in parallel with the storage plate over a top surface of the second insulating layer, and a plurality of second portions respectively protruding from the first portion toward the storage plate through the plurality of through holes.

6. The discrete decoupling capacitor of claim 1, further comprising a first contact plug extending in the vertical direction at a position spaced apart from the capacitor block in the horizontal direction, having a bottom surface contacting the storage plate, and electrically connected to the first conductive pad through the first conductive path of the wiring structure.

7. The discrete decoupling capacitor of claim 1, further comprising a plurality of second contact plugs arranged between the top plate and the wiring structure, wherein the second conductive pad is electrically connected to the top plate through the plurality of second contact plugs.

8. The discrete decoupling capacitor of claim 1, wherein the plurality of capacitor structures shares one lower electrode contacting an internal wall of the plurality of through holes and the storage plate.

9. The discrete decoupling capacitor of claim 1, wherein each of the plurality of capacitor structures comprises lower electrodes respectively arranged in the plurality of through holes and contacting the storage plate, and
the lower electrodes of the plurality of capacitor structures are spaced apart in the horizontal direction.

10. The discrete decoupling capacitor of claim 1, wherein the plurality of capacitor structures are arranged in the horizontal direction in a hexagonal array structure.

11. An integrated circuit chip package comprising the discrete decoupling capacitor of claim 1.

12. The discrete decoupling capacitor of claim 1, further comprising a substrate, the first insulating layer covering a top surface of the substrate and a thickness of the substrate is less than a thickness of the first insulating layer in the vertical direction.

13. The discrete decoupling capacitor of claim 1, wherein the plurality of capacitor structures has a height in the vertical direction ranging from about 1 μm to about 2 μm, and
the plurality of capacitor structures is arranged with a pitch ranging from about 80 nm to about 150 nm.

14. A discrete decoupling capacitor comprising:
a first insulating layer extending in a horizontal direction;
a storage plate arranged on the first insulating layer;
a second insulating layer arranged on the storage plate;
a first capacitor block including a plurality of first capacitor structures connected to the storage plate through the second insulating layer in a vertical direction;
a first top plate arranged on the second insulating layer and connected to the first capacitor block;
a second capacitor block spaced apart from the first capacitor block in the horizontal direction and including a plurality of second capacitor structures connected to the storage plate in the vertical direction through the second insulating layer;
a second top plate arranged on the second insulating layer at a position spaced apart from the first top plate in the horizontal direction and connected to the second capacitor block,
wherein the plurality of first capacitor structures and the plurality of second capacitor structures are arranged in a hexagonal array structure in a same plane in the horizontal direction;
a wiring structure covering the first top plate and the second top plate;
a first conductive pad arranged on the wiring structure and electrically connected to the storage plate through a first conductive path of the wiring structure; and
a second conductive pad spaced apart from the first conductive pad in the horizontal direction in a same horizontal plane as the first conductive pad and electrically connected to the first top plate and the second top plate through a second conductive path of the wiring structure.

15. The discrete decoupling capacitor of claim 14, wherein each of the plurality of first capacitor structures and the plurality of second capacitor structures comprises a lower electrode, a dielectric layer, and an upper electrode sequentially stacked on the storage plate, and each of the lower electrode, the dielectric layer, and the upper electrode is cylindrical.

16. The discrete decoupling capacitor of claim 14, wherein the plurality of first capacitor structures and the plurality of second capacitor structures are respectively arranged with a pitch ranging from about 80 nm to about 150 nm.

* * * * *